US012777729B2

(12) United States Patent
Duane et al.

(10) Patent No.: US 12,777,729 B2
(45) Date of Patent: Oct. 27, 2026

(54) SEMICONDUCTOR SENSOR FOR RADIATION DOSIMETRY

(71) Applicant: UNIVERSITY COLLEGE CORK—NATIONAL UNIVERSITY OF IRELAND, CORK, Cork (IE)

(72) Inventors: Russell Duane, Cork (IE); Aleksandar Jaksic, Cork (IE); Nikola Vasovic, Cork (IE)

(73) Assignee: UNIVERSITY COLLEGE CORK—NATIONAL UNIVERSITY OF IRELAND, Cork (IE)

( * ) Notice: Subject to any disclaimer, the term of this patent is extended or adjusted under 35 U.S.C. 154(b) by 373 days.

(21) Appl. No.: 18/018,008

(22) PCT Filed: Jul. 8, 2021

(86) PCT No.: PCT/EP2021/068974

§ 371 (c)(1),
(2) Date: Jan. 25, 2023

(87) PCT Pub. No.: WO2022/022974

PCT Pub. Date: Feb. 3, 2022

(65) Prior Publication Data

US 2024/0184000 A1 Jun. 6, 2024

(30) Foreign Application Priority Data

Jul. 29, 2020 (GB) ...................................... 2011801

(51) Int. Cl.
*G01T 1/02* (2006.01)
*G01K 7/00* (2006.01)
(Continued)

(52) U.S. Cl.
CPC ............ *H10F 30/298* (2025.01); *G01K 7/00* (2013.01); *G01T 1/026* (2013.01); *G01T 1/24* (2013.01); *G01T 1/244* (2013.01); *H10F 77/14* (2025.01)

(58) Field of Classification Search
CPC .. G01T 1/02; G01T 1/026; G01T 1/24; G01T 1/241; G01T 1/243; G01T 1/244; G01T 1/247; G01T 1/249; H10F 30/298
(Continued)

(56) References Cited

U.S. PATENT DOCUMENTS 4,213,045 A * 7/1980 Fraass ..................... G01T 1/026 250/370.07
5,332,903 A 7/1994 Buehler et al.
(Continued)

OTHER PUBLICATIONS

Marko Andjelkovic et al., A Design Concept for Radiation Hardened RADFET Readout System for Space Applications, Microprocessors and Microsystems vol. 90, Apr. 2022, 104486. (Year: 2022).*
(Continued)

*Primary Examiner* — Allen C. Ho
(74) *Attorney, Agent, or Firm* — Clark Hill PLC; James R. Foley

(57) ABSTRACT

The present invention provides a radiation dosimeter with improved sensitivity. The sensor apparatus comprises a semiconductor structure, a means for biasing the semiconductor structure to readout stored charge in its dielectric by exhibiting a sensor current-voltage characteristic which is proportional to the dielectric stored charge, and a means for determining a change in current-voltage characteristic of the sensor terminal due to irradiation. The semiconductor substrate comprises a bulk region of a first conductivity type formed in the substrate, a source region and a drain region formed in the bulk region, wherein the source region and the
(Continued)

drain region are of a second conductivity type opposite to the first conductivity type, a channel region formed between the source region and the drain region, a dielectric formed on the channel region for storing charge due to irradiation, and a gate electrode formed on the dielectric. The means for biasing configures the semiconductor structure such that the gate electrode and the source region are electrically connected to form a sensor terminal, and the bulk is biased with a fixed voltage such that it is reverse biased with respect to the sensor and the drain, and the drain is biased with a fixed voltage such that it sinks channel current sourced from the sensor terminal, and wherein the channel region is configured to provide a channel current from the sensor to the drain which is larger in magnitude than the reverse biased bulk-sensor and bulk-drain diode currents.

25 Claims, 20 Drawing Sheets

(51) Int. Cl.
*G01T 1/24* (2006.01)
*H10F 30/298* (2025.01)
*H10F 77/14* (2025.01)

(58) Field of Classification Search
USPC .............................. 250/370.09; 378/98.8, 19
See application file for complete search history.

(56) References Cited

U.S. PATENT DOCUMENTS

| | | | | |
|---|---|---|---|---|
| 5,493,231 | A | 2/1996 | Nicollian et al. | |
| 5,929,449 | A * | 7/1999 | Huang | G01T 1/244 250/370.08 |
| 6,794,630 | B2 * | 9/2004 | Keshavarzi | G01T 1/026 250/370.07 |
| 8,080,805 | B2 * | 12/2011 | Gordon | H01L 31/119 250/370.09 |
| 8,519,345 | B2 * | 8/2013 | Arsalan | G01T 1/026 250/370.07 |
| 9,590,611 | B2 * | 3/2017 | Cole | G01T 1/026 |
| 9,595,519 | B2 * | 3/2017 | Titus | H10D 30/615 |
| 9,804,273 | B2 * | 10/2017 | Scott | G01T 1/026 |
| 9,817,130 | B1 * | 11/2017 | Carr | G01T 1/026 |
| 9,823,358 | B2 * | 11/2017 | Scott | G01T 1/026 |
| 10,109,662 | B2 * | 10/2018 | Lee | H10F 39/014 |
| 10,281,597 | B2 * | 5/2019 | Tredwell | G01T 1/241 |
| 10,481,278 | B2 * | 11/2019 | Syme | G01T 1/026 |
| 10,957,707 | B2 * | 3/2021 | Yau | G01T 1/026 |
| 11,061,146 | B2 * | 7/2021 | Yau | G01T 1/026 |
| 11,158,756 | B2 * | 10/2021 | Reznicek | G01T 1/026 |
| 2003/0111591 | A1 | 6/2003 | Keshavarzi et al. | |

OTHER PUBLICATIONS

Holmes-Siedle A: "The Space-Charge Dosimeter General Principles of a New Method Ofradiation Detection", Nuclear Instruments and Methods, North-Holland, vol. 121, No. 1, Oct. 1, 1974 (Oct. 1, 1974), pp. 169-179, XP008042367, ISSN: 0029-554X, DOI: 10.1016/0029-554X(74)90153-0 section 3.1, figures 3, 6, 7.

* cited by examiner

SEMICONDUCTOR SENSOR FOR RADIATION DOSIMETRY

This application is a National Phase Filing of PCT/EP2021/068974, having an International filing date of Jul. 8, 2021, which claims priority of Great Britain Patent Application No. 2011801.4, filed Jul. 29, 2020. The disclosure of the foregoing are hereby incorporated by reference.

FIELD

The present invention relates to a radiation dosimeter. More particularly, the invention relates to a radiation dosimeter with improved sensitivity.

BACKGROUND

The RADiation sensitive MOSFET (RADFET) is a silicon based radiation-measuring device or dosimeter. It comprises a Metal Oxide Semiconductor Field Effect Transistor (MOSFET) which has been specifically designed to be sensitive to ionizing radiation. However, unlike a semiconductor diode, a RADFET is capable of operating with no power during irradiation, so it is classified as a passive dosimeter.

A RADFET operates by trapping charge in the gate dielectric during irradiation, and sensing this charge electrically through changes in the operation of the MOSFET transistor. Electron hole pairs are created in the dielectric by the incident radiation. A vertical electric field across the dielectric, where vertical means between gate and semiconductor regions, is required to force generated electrons to leave the dielectric, leaving behind holes, some of which are stored or trapped in trap centres. The magnitude and location of stored charge in the dielectric is very sensitive to the vertical dielectric field during irradiation, particularly near the source edge which has the largest influence on the operation of the MOSFET transistor. RADFET terminals should either be biased with fixed biases during irradiation or alternatively all terminals should be tied together or grounded in what is called the unbiased mode. In unbiased mode, which is advantageous in terms of not requiring power supply during irradiation, grounding resistors and other elements such as ESD or EMI protection devices should be used to ensure all terminals are at the same potential.

This stored charge in the dielectric is then read out by readout circuitry through biasing the MOSFET transistor such that a change in gate-source voltage with irradiation dose can be recorded. Stored charge in the dielectric will shift the flat-band voltage $V_{fb}$, threshold voltage $V_{th}$ and gate-source voltage at a fixed drain-source current $V_{fixedcurrent}$ of the RADFET in accordance with the following equation:

$$|\Delta V_{output}| = \frac{|\Delta Q_{RAD}|}{C_{SENSOR}} = \frac{|\Delta Q_{RAD}|}{C_{OX}} = \frac{f(\text{Radiation Dose})}{C_{OX}} \quad (1)$$

where $V_{output}$ is either $V_{th}$, $V_{fb}$ or $V_{fixedcurrent}$; $Q_{RAD}$ is the amount of charge in the dielectric (which is an increasing function of incident irradiation dose), and $C_{SENSOR}$ is the charge sensing capacitance of the RADFET sensor and which is equal to the dielectric capacitance $C_{OX}$ for RADFET sensors. Radiation dose is typically measured in units of Gray (Gy). The voltage sensitivity of the detector (S) to radiation dose can then be expressed in units of m V/mGy:

$$S\left[\frac{\text{mV}}{mGy}\right] = \frac{\Delta V_{output}}{\text{Radiation Dose}} \quad (2)$$

Typically, a p-type RADFET is biased in a diode connected MOSFET configuration with the gate and drain connected together and the source and bulk shorted. Either a negative current is forced into the gate/drain node or a positive current is forced into the source/bulk node and the corresponding detector voltage is recorded. The current in both cases is typically called the readout current ($I_{RC}$). The change in the readout voltage ($V_{RC}$) with radiation dose, which is determined by the change in gate-source voltage required to maintain a constant channel current in the MOSFET, follows the above equations, and the sensitivity of the RADFET to irradiation dose is recorded.

A typical readout configuration for a readout circuit of a diode connected MOSFET is shown in FIG. 1A. FIG. 1B shows a current-voltage characteristic for the readout circuit of FIG. 1A before and after radiation to 10Gy where the device has a width of 300 μm, a length of 50 μm, a dielectric thickness of 400 nm and a substrate doping of 1E+15 atoms per $cm^3$. It can be seen from this figure that the virgin characteristic is shifted by a constant amount of −0.65V after irradiation, which gives a sensitivity of 0.065 mV/mGy. As expected from equation (1), the voltage sensitivity to irradiation of the device is insensitive to the operating current of the readout circuit, as $C_{ox}$ is insensitive to variations in applied MOSFET voltages.

A specific diode connected MOSFET current exists where the temperature coefficient of the RADFET is minimised. This current is called the MTC (Minimum temperature Coefficient) current. It will be appreciated that minimising the temperature coefficient allows lower doses to be detected, as the temperature drift of the detector determines the noise floor in all practical applications.

One drawback of RADFET dosimeters is that they provide poor voltage sensitivity. As a result, they are currently only used commercially for high radiation dose applications such as radiotherapy, military, and aerospace applications. The lower dose limit for commercial passive mode RADFETs is 10 mGy, which prevents their use in the important medical fields of dental and CT x-ray procedures, where a 0.3 mGy minimum dose is required to be competitive with conventional TLD or OSLD detectors.

The low sensitivity to radiation dose of a conventional RADFET is due to the small thickness (~1 μmetre) of the sensing dielectric, which limits the sensitivity in two ways. Firstly, the thin dielectric stops only a small fraction of incident irradiation, which limits $Q_{rad}$. Furthermore, the thin dielectric also exhibits a large capacitance per unit/area, which limits voltage sensitivity as defined in equations (1) and (2) as follows:

$$\Delta V_{output} = (R_{ox} * t_{ox}) * \frac{t_{ox}}{\epsilon_{ox}} = \frac{R_{ox} * t_{ox}^2}{\epsilon_{ox}} \quad (3)$$

where $R_{ox}$ is a coefficient which linearly relates $Q_{rad}$ to the thickness of the sensing dielectric $t_{ox}$, and $\varepsilon_{ox}$ is the dielectric permittivity of the sensing dielectric.

There has been research into how to improve the sensitivity of RADFET dosimeters. One means of improving the sensitivity involves increasing the thickness of the dielectric, to simultaneously stop more incident irradiation and reduce the capacitance, with sensitivities of 0.3 mV/mGy having been recorded. However, growing a quality dielectric of 1 μm thick takes many hours in the fabrication facility, thus significantly increasing the cost of the detector. Furthermore, growing oxides greater than 1 μm thick has been shown to cause high stresses in the silicon semiconductor substrate, which affects device performance.

Another technique involves using high Z dielectric materials instead of silicon dioxide to stop more incident photons per unit volume and increase $Q_{rad}$. However, the dielectric constant of such materials is higher than silicon dioxide, which results in an increase in the capacitance and a decrease in the sensitivity.

There has also been some research into MOS based thin film transistors on IGZO semiconductor with a combination of silicon dioxide and Tantalum dioxide as the gate dielectric material. This combination has shown sensitivities of 3.4 mV/mGy for X-ray energies when the RADFET is operating in passive mode. However, the minimum dose which has been recorded for such a device is 5 mGy, which suggests that temperature drift prevents lower dose measurements with this device. Additionally, the device has been shown to suffer from poor charge retention or fading, with 80% of the charge being lost within 2000 seconds after irradiation. This high fading limits the use of this device to applications which only need to retain dose information for a short time after irradiation.

The sensitivity of a RADFET can be increased by applying bias during irradiation to increase $Q_{rad}$. However, such dosimeters require a power source, which makes them less attractive than passive RADFETs for a range of applications.

Commercial dosimeters which utilise two RADFETS with applied bias during irradiation have shown sensitivities of 3 mV/mGy and improved the minimum dose level to 1.7 mGy. However, this does still not have a competitive advantage over other dosimeters, such as TLD which minimum dose of 0.3 mGy.

Sensitivity can also be increased by stacking a number of RADFETs in series. However, this arrangement suffers from a very high output voltage (>10V), as well as significant temperature drift. This limit the usefulness of these dosimeters in real world applications.

Alternative Metal Insulator Semiconductor (MIS) based device structures which use capacitance readout techniques such as MIS capacitors and Silicon On Insulator (SOI) capacitor structures have been investigated. However, these structures have to date not demonstrated an improvement in minimum dose values over conventional RADFET technology.

It is thus an objective of the present invention to provide a sensor apparatus which overcomes at least one of the above-mentioned problems associated with existing RADFET dosimeters.

SUMMARY

According to the invention, there is provided, as set out in the appended claims, a sensor apparatus comprising:

- a semiconductor structure comprising:
  - a semiconductor substrate,
  - a bulk region of a first conductivity type formed in the substrate,
  - a source region and a drain region formed in the bulk region, wherein the source region and the drain region are of a second conductivity type opposite to the first conductivity type,
  - a channel region formed between the source region and the drain region,
  - a dielectric formed on the channel region for storing charge due to irradiation, and
  - a gate electrode formed on the dielectric;
- means for biasing the semiconductor structure to readout stored charge in the dielectric by exhibiting a sensor current-voltage characteristic which is proportional to the dielectric stored charge, wherein the means for biasing configures the semiconductor structure such that:
  - the gate electrode and the source region are electrically connected to form a sensor terminal, and the bulk is biased with a fixed voltage such that it is reverse biased with respect to the sensor and the drain, and the drain is biased with a fixed voltage such that it sinks channel current sourced from the sensor terminal, and
  - wherein the channel region is configured to provide a channel current from the sensor to the drain which is larger in magnitude than the reverse biased bulk-sensor and bulk-drain diode currents; and
- means for determining a change in current-voltage characteristic of the sensor terminal due to irradiation to provide a measurement of the irradiation dose to which the semiconductor structure was exposed.

In one embodiment, the channel region further comprises an activated channel implant of the opposite conductivity type to the bulk region.

In one embodiment, the peak of the channel implant is located below and spaced apart from the dielectric.

In one embodiment, an electrode further contacts the source region to form a sensor electrode, and wherein the sensor electrode and the gate electrode are electrically connected to form the sensor terminal during electrical readout of the stored charge in the dielectric.

In one embodiment, bias is applied to the gate electrode during irradiation.

In one embodiment, the gate electrode further contacts the source region to form a sensor electrode, and wherein the sensor terminal is connected to the sensor electrode for electrical readout of the stored charge in the dielectric.

In one embodiment, the means for determining a change in the current-voltage characteristic of the sensor terminal comprises means for determining for a given constant sensor to drain current applied to the semiconductor structure the change in sensor to bulk voltage due to irradiation of the semiconductor structure.

In one embodiment, the sensor apparatus further comprises a current source provided between the sensor and drain for applying the constant sensor to drain current, and wherein the means for determining the change in sensor to bulk voltage comprises a voltmeter provided between the sensor and bulk.

In one embodiment, the change in the sensor to bulk voltage due to irradiation corresponds to the sensor voltage, $\Delta V_{SENSOR}$, and wherein $\Delta V_{SENSOR}$ for a constant sensor to drain current, the sensor current, is in accordance with the following expression:

$$|\Delta V_{SENSOR}| - |\Delta Q_{RAD}|/C_{SENSOR}$$

where $\Delta Q_{RAD}$ is the charge of the dielectric due to irradiation and $C_{SENSOR}$ is the charge sensing capacitance, with $C_{SENSOR}=C_{BULK}+C_{DRAIN}$, where $C_{BULK}$ is the bulk to channel depletion capacitance and $C_{DRAIN}$ is the drain to channel depletion capacitance, and wherein $C_{BULK}$ is inversely proportional to the width of the bulk depletion layer, $t_b$, and $C_{DRAIN}$ is inversely proportional to the length of the channel region, L, and where $t_b$ and L are designed such that $C_{SENSOR}$ is of lower magnitude than $C_{DIELECTRIC}$.

In one embodiment, the bulk doping and the length of the channel region are configured such that $C_{DRAIN}$ is negligible, such that the change in the sensor to bulk voltage $\Delta V_{SENSOR}$ due to irradiation for a constant sensor to drain current is in accordance with the following expression:

$$|\Delta V_{SENSOR}| - |\Delta Q_{RAD}|/C_{BULK}$$

In one embodiment, the length of the channel region, L, is less than the width of the bulk depletion layer, to, at maximum sensor to bulk voltage.

In one embodiment, the bulk region comprises a retrograde doping profile.

In one embodiment, the bulk region comprises a doped semiconductor layer on top of a doped substrate, where the doping level of the substrate is higher than the doping level of the semiconductor layer and optionally wherein the semiconductor layer is grown by epitaxy.

In one embodiment, the thickness of the doped semiconductor layer is less than the width of the bulk depletion layer, $t_b$, during readout of the stored charge in the semiconductor structure.

In one embodiment, the sensor to drain current applied by the current source is selected to minimise the thermal drift of the sensor to bulk voltage.

In one embodiment, the sensor apparatus further comprises a means for monitoring temperature of the semiconductor structure and a means for compensating for thermal drift of the sensor to bulk voltage.

In one embodiment, the means for monitoring temperature of the semiconductor structure comprises a forward biased diode located on the semiconductor substrate.

In one embodiment, the diode comprises the source to bulk diode or the drain to bulk diode which is biased in forward region of operation.

In one embodiment, the dielectric comprises a high Z material.

In one embodiment, the bulk region comprises a semiconductor substrate.

In another embodiment of the invention there is provided a sensor circuit comprising:

a first sensor apparatus; and a second sensor apparatus, wherein the first sensor apparatus and the second sensor apparatus comprise the same semiconductor substrate, wherein the first sensor apparatus and the second sensor apparatus have the same thermal drift, and wherein the sensitivity to irradiation of the second sensor apparatus is configured to be different than the sensitivity to irradiation of the first sensor apparatus;

means for determining a differential output voltage signal between the first sensor apparatus and the second sensor apparatus; and means for compensating for temperature drift of the sensor circuit based on the differential output voltage signal.

In another embodiment of the invention there is provided a wearable patch comprising the sensor apparatus, and further comprising means for transmitting the measured irradiation dose to a remote system and/or further comprising a display means for displaying the measured irradiation dose.

In one embodiment of the sensor apparatus or sensor circuit, the semiconductor structure is incorporated into a wearable patch and wherein the means for biasing the semiconductor structure and the means for determining a change in current-voltage characteristic of the sensor terminal due to irradiation are incorporated into an electronic reader connectable to the patch, wherein the electronic reader is connected to the patch during readout.

In one embodiment of the sensor apparatus or sensor circuit, the semiconductor structure and the means for biasing the semiconductor structure are incorporated into a wearable patch and wherein the means for determining a change in current-voltage characteristic of the sensor terminal due to irradiation is incorporated into an electronic device, and wherein the patch further comprises means for transmission of sensor current and voltage data to the electronic device to measure the irradiation dose.

In one embodiment, the patch further comprises an electronic memory and/or an identification means, and optionally wherein the identification means comprises a barcode.

BRIEF DESCRIPTION OF THE DRAWINGS

The invention will be more clearly understood from the following description of an embodiment thereof, given by way of example only, with reference to the accompanying drawings, in which:—

DETAILED DESCRIPTION OF THE DRAWINGS

The sensor apparatus of the present invention comprises a semiconductor structure, a means for biasing the semiconductor structure during electrical readout and a means for determining the irradiation dose to which the semiconductor structure was exposed. Each of these elements will be explained in following paragraphs.

Figure 2A:
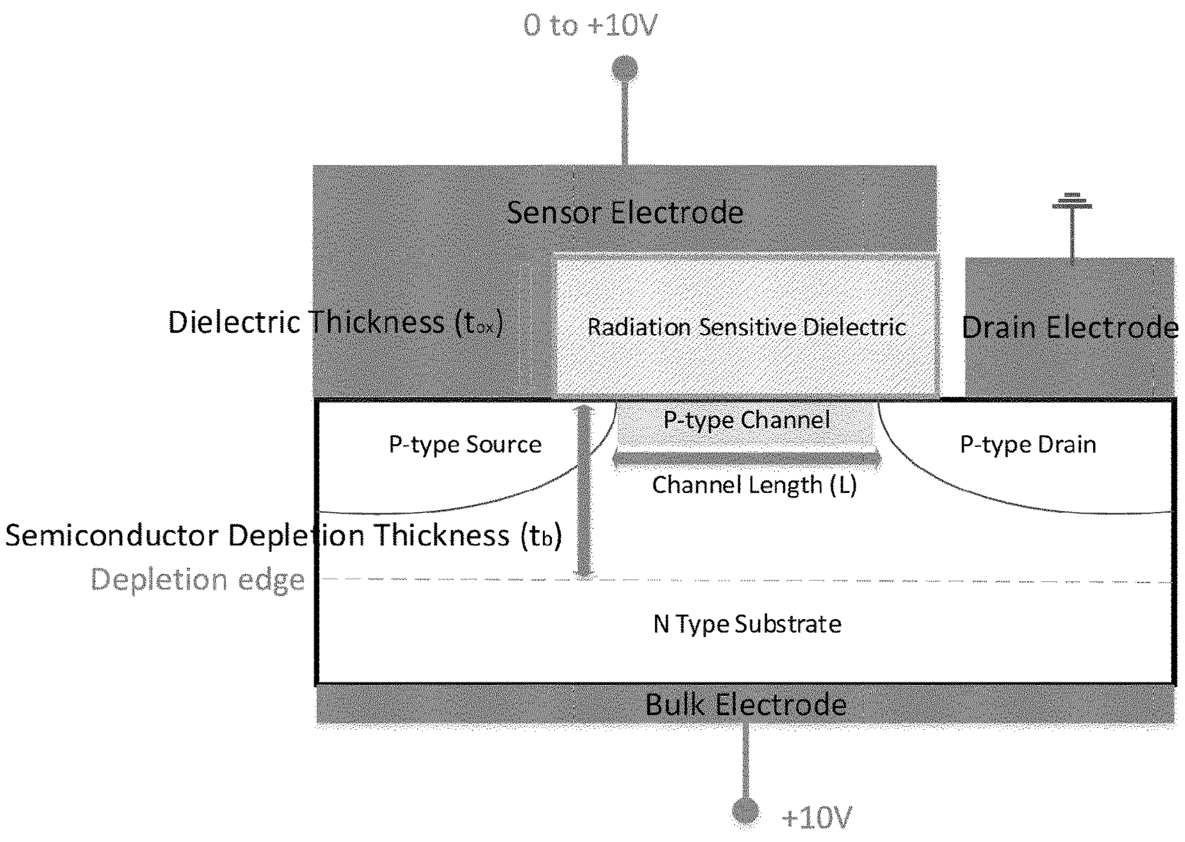
FIG. 2A shows a first embodiment of the architecture of the sensor apparatus the present invention.

FIG. 2A shows a first embodiment of the semiconductor structure and readout bias of the sensor apparatus of the present invention. The semiconductor structure of the sensor apparatus comprises a MIS device with a MOSFET like structure comprising two semiconductor regions of opposite dopant type to the bulk semiconductor dopant, with a semiconductor channel region formed between these regions. Following MOSFET terminology, these two regions are called source and drain. A dielectric sensitive to irradiation is formed over the channel region. In this preferred embodiment, a sensor electrode is formed to be continuous over the dielectric and the source regions. In this embodiment, a drain electrode is connected to the drain region and a bulk electrode is connected to the bulk semiconductor region. However, it will be appreciated that in other embodiments the electronic connection may be provided by an alternative suitable conducting means to the source, drain and bulk regions rather than an electrode, such as for example by semiconductor conductors.

The bulk semiconductor region is a semiconductor region which can consist of either a semiconductor substrate or a semiconductor layer deposited on top of a semiconductor substrate or a dopant diffusion, such as for example a well diffusion in the semiconductor substrate. The bulk semiconductor region can also consist of a semiconductor layer formed on an insulator such as in Silicon On Insulator technology. The bulk can be electrically contacted at the top surface of the bulk region. Alternatively, the bulk can be electrically contacted on the back surface of the bulk region when the bulk region consists of a semiconductor substrate, as depicted in FIG. 2A for example.

In the embodiment shown in FIG. 2A, the semiconductor structure comprises a p-type MIS dosimeter in an n-type bulk semiconductor. However, it will be appreciated that an n-type MIS sensor in a p-type bulk semiconductor can also be easily realised by reversing the polarities of the doping and applied biases.

In one embodiment of the invention, silicon dioxide is used as the dielectric material. However, the silicon dioxide is fabricated using a specialised process in order to enhance the sensitivity of this dielectric material to incident irradiation. Alternatively, a dielectric material which is more sensitive to radiation than silicon dioxide could be used, such as for example a high atomic number (high Z) insulating material such as Hafnium Dioxide.

As is the case for conventional MIS based dosimeters, the charge deposited in the dielectric of the semiconductor structure of the present invention during irradiation is proportional to the dose (or amount) of incident radiation and is also proportional to the vertical electric field in the dielectric during irradiation. The generated charge during irradiation which has the most influence on its electrical characteristics of MIS based dosimeters is the charge located close to the source region junction. This is due to the fact that this junction determines the channel current flow. Unlike other MIS based dosimeters such as MOSFETS, the composition of the sensor electrode of the present invention ensures that the vertical electric field in the dielectric near the source region junction is not affected by electrical disturbance during irradiation thus ensuring stable charge generation and sensitivity to irradiation. The composition of the sensor electrode of the present invention consequently reduces the requirement for external components, such as grounding resistors, for the sensor apparatus during irradiation in comparison with other MIS based dosimeters where the gate and source regions have separate electrical connections.

After incident irradiation causes a change in the stored charge in the dielectric, this change in stored charge is electrically readout to provide a measure of the incident irradiation dose. For the PMOS sensor structure in FIG. 2A, the applied voltages during readout are +10V on the bulk while the drain voltage is grounded and the sensor voltage varies between 0 and +10V. It should be understood that, during electrical readout of the stored charge, the charge sensing capacitance $C_{SENSOR}$ of the semiconductor structure of the present invention is not equal to the dielectric capacitance as for MOSFET based sensors and should be designed to be as small as practically possible as explained in the following paragraphs.

The semiconductor structure is configured in terms of material properties such that, during electrical readout of the stored charge in the dielectric, there is a measurable current, greater in magnitude than the reverse biased diode currents, flowing in the channel from the sensor electrode to the drain region when a reverse bias is applied to the bulk region with respect to the sensor and drain regions and when the drain region is biased with respect to the sensor electrode such that it sinks channel current sourced from the sensor electrode. The channel current needs to be greater in magnitude than the reverse biased diode currents to ensure that these diode currents do not influence the electrical readout of the stored charge in dielectric.

Configuring the semiconductor structure to ensure that measurable channel current flows from the sensor to the drain with reverse bias applied to the bulk region with respect to the sensor and drain can be achieved in a number of ways. In one preferred embodiment, this is achieved by implanting a dopant of opposite conductivity type to the bulk region into the channel region and subsequently activating this dopant by annealing. In another embodiment, charge can be incorporated in the dielectric in order to induce a mirror charge in the channel which is of the opposite polarity to the bulk dopant. In another embodiment, a sensor electrode metal can be chosen which has a high work function (for a PMOS type device) and which can also provide a good ohmic contact to the source region. Other methods of configuring the semiconductor structure to ensure channel current flows will be known to those skilled in the art.

Figure 1A:
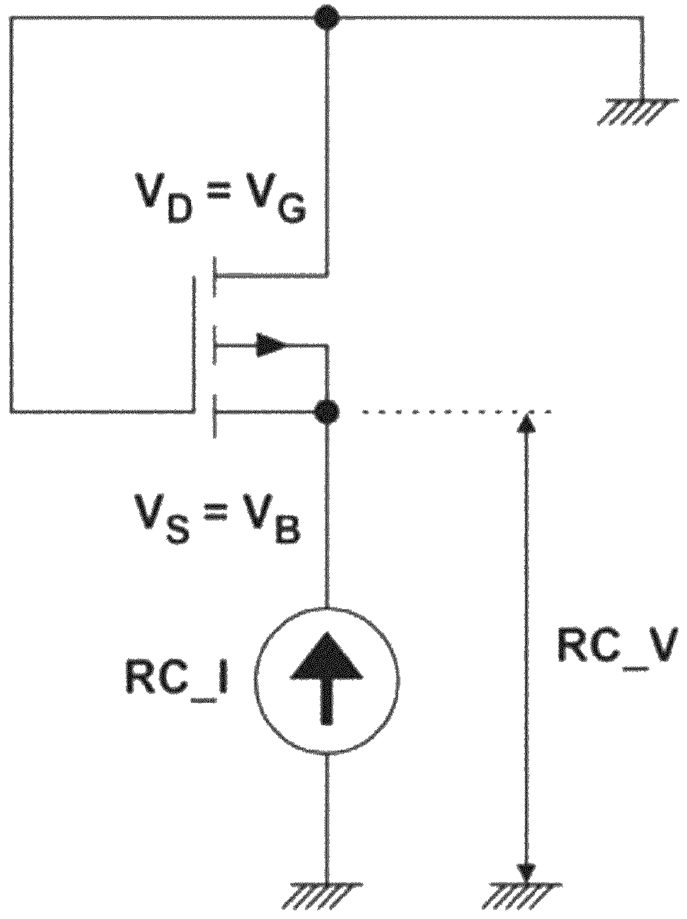
FIG. 1A shows a typical readout configuration for a diode connected MOSFET readout circuit.
Figure 2B:
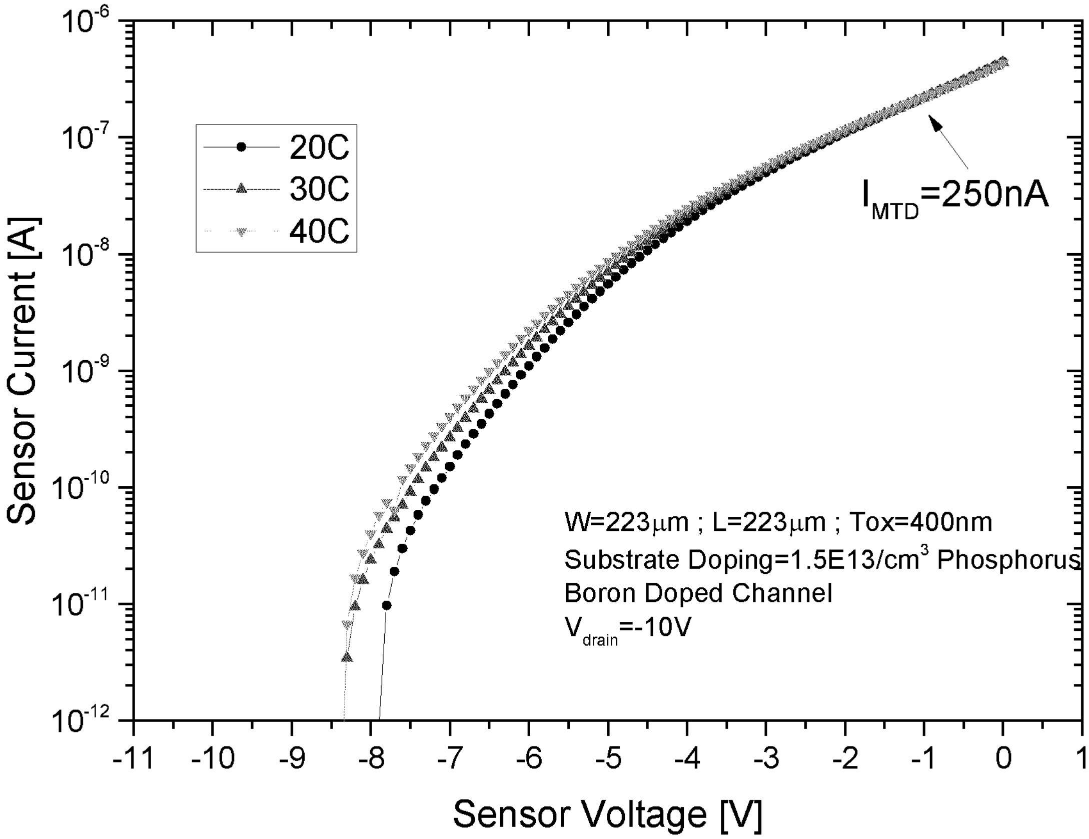
FIG. 2B shows the measured sensor current versus sensor voltage characteristics of the sensor apparatus of FIG. 2A with Channel Length (L)-223 μm and Oxide Thickness ($T_{ox}$)=400 nm as a function of temperature.

In one exemplary embodiment, the semiconductor structure of the sensor apparatus is fabricated with a high resistivity (300 Ohm-cm) n-type phosphorus doped bulk silicon substrate, with a 400 nm thick silicon dioxide dielectric sensitive to radiation (which is also used in commercial RADFET products such as the one shown in FIG. 1A), and a 1 micron thick aluminium alloy layer which is patterned to produce the sensor electrode, drain electrode and the bulk electrode on the top surface of the silicon substrate. Diffusions of heavily doped boron >1E+19 atoms $cm^{-3}$ are used for the source and drain regions while a heavily doped phosphorus diffusion of >1E+19 atoms $cm^{-3}$ is used to form an ohmic contact between the semiconductor substrate and the bulk electrode on the semiconductor surface. The length of the channel is fabricated to be 223 microns, while the width of the semiconductor structure is fabricated to also be 223 microns. A p-type channel is formed using boron implantation into the channel region which is subsequently activated through annealing. FIG. 2B shows the measured sensor current versus sensor voltage characteristics of a sensor apparatus fabricated with such geometry for an applied drain voltage of 0V and for a bulk voltage of 10V for three different operating temperatures, namely 20 degrees Celsius, 30 degrees Celsius and 40 degrees Celsius.

To understand all of the different embodiments of the invention which can provide an electrical readout of the stored charge in the dielectric, it is first necessary to understand the sensor current-voltage characteristic when the bulk is biased with a fixed voltage such that it is reverse biased with respect to sensor and drain and the drain is biased such that it sinks current from the sensor terminal. In order to explain the sensor operation, it is convenient to reference all voltages to the bulk electrode potential, so the drain electrode potential is −10V with reference to the bulk electrode and the sensor voltages are also negative with reference to the bulk electrode as shown in FIG. 2B. When the sensor voltage is equal to the drain voltage of −10V, only reverse biased junction currents flow from the sensor and drain to the bulk electrode. However, as the sensor voltage is swept from the drain voltage to the bulk voltage, the sensor current which flows between the sensor electrode and the drain electrode increases above the reverse biased diode currents. The sensor current is a channel current which flows from the sensor electrode to the drain region. This channel current is primarily determined by the sensor barrier height ($\Phi_B$) between the p-type source region and the channel. As the sensor to bulk voltage decreases, the effective reverse bias across the sensor junction decreases, which results in an increase in the sensor current. While in a MOSFET or RADFET device, the channel current under the dielectric is governed primarily by the gate to source voltage difference, the channel current of the sensor apparatus of the present invention is governed by the sensor to bulk voltage difference. This difference in device operation results in the sensor apparatus of the present invention being a more sensitive detector of charge stored in the dielectric when compared to a conventional MOSFET dosimeter as explained in the following paragraphs.

Figure 2C:
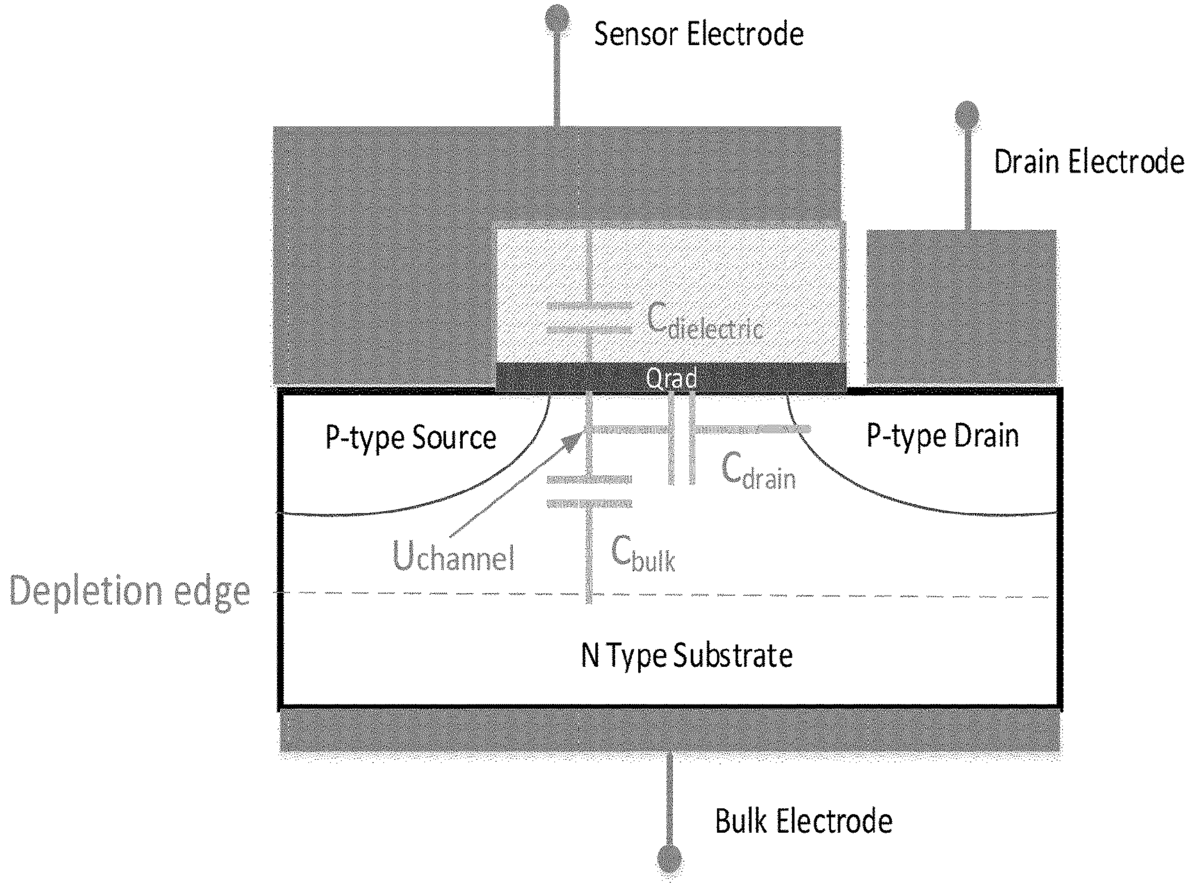
FIG. 2C shows an equivalent capacitance model of the sensor apparatus of the present invention.

A qualitative equivalent capacitance model of the semiconductor structure of the sensor apparatus of the present invention is shown in FIG. 2C. Radiation induced charge ($Q_{RAD}$) is assumed to be located at the semiconductor/dielectric interface. The change in channel potential ($U_{CHANNEL}$) at the source edge due to variations in irradiated oxide charge and applied sensor voltage can be expressed as follows:

$$\Delta U_{CHANNEL} = \frac{\Delta Q_{RAD}}{C_{TOTAL}} + \left(\frac{\Delta V_{SENSOR}}{C_{TOTAL}}\right) * (C_{DIELECTRIC}) \quad (4)$$

where $C_{TOTAL}$ is the sum of the channel capacitances, $C_{DIELECTRIC}$ (alternatively called $C_{OX}$), $C_{BULK}$ and $C_{DRAIN}$: $\Delta V_{SENSOR}$ is the change in sensor voltage and $\Delta Q_{RAD}$ is the change in the charge in the dielectric due to incident irradiation. $C_{BULK}$ is the bulk to channel depletion capacitance and $C_{DRAIN}$ is the drain to channel capacitance which represents the amount of barrier height lowering at the source edge due to the drain voltage. $C_{DRAIN}$ is only significant for devices which are designed such that the drain voltage exhibits control of the channel current and these devices typically have shorter channel lengths.

The sensor barrier height is the difference in electric potential between the channel and the source regions. The change in sensor barrier height ($\Phi_B$) due to variations in irradiated oxide charge and applied sensor voltage can be expressed as follows:

$$\Delta\phi_B = \Delta U_{CHANNEL} - \Delta V_{SENSOR} = \frac{\Delta Q_{RAD}}{C_{TOTAL}} - \left(\frac{\Delta V_{SENSOR}}{C_{TOTAL}}\right) * (C_{BULK} + C_{DRAIN}) \quad (5)$$

The sensor current is primarily determined by the barrier height between the source region and the channel. Therefore, the change in dielectric charge due to a received irradiation dose ($\Delta Q_{RAD}$) may be readout by monitoring the change in sensor current using a current meter before and after said irradiation dose. During the sensor current readout, the voltages on the sensor, drain and bulk electrodes are fixed.

In accordance with the sensor apparatus of the present invention, the change in dielectric charge due to a received irradiation dose may be readout by, with the bulk and drain voltages fixed, measuring the sensor current-voltage characteristic before and after irradiation and recording the change in this characteristic. This sensor current-voltage characteristic can be measured by sourcing either current or voltage at the sensor terminal and measuring the corresponding sensor to bulk voltage or sensor to drain current. The sensor current is sourced between sensor and drain while the sensor voltage is measured between sensor and bulk. The change or shift of the sensor current-voltage characteristic before and after irradiation is a measure of the change in stored charge in the dielectric and hence of the amount or dose of incident irradiation. It is recommended to measure the change of the characteristic along the voltage axis such that a change in sensor voltage for a range of sensor currents can be used as a measure of the change in dielectric charge.

In the first embodiment of the invention, the change in dielectric charge due to a received irradiation dose is measured or readout by a biasing means forcing a constant sensor to drain current through the semiconductor structure from a sensor terminal which is connected to the sensor electrode using a constant current source before and after irradiation, and a means for determining the change in sensor to bulk voltage required to maintain this constant sensor to drain current. During the sensor voltage readout, the voltages on the bulk and drain electrodes remain fixed. By forcing a constant sensor to drain current before and after irradiation, the sensor barrier height in Equation (5) remains constant, which means that the left term of the equation is zero and, the following relationship for sensor voltage sensitivity to dielectric charge and hence radiation dose for a constant sensor current can be obtained:

$$|\Delta V_{SENSOR}| = \frac{|\Delta Q_{RAD}|}{C_{BULK} + C_{DRAIN}} = \frac{|\Delta Q_{RAD}|}{C_{SENSOR}} = \frac{f(\text{Radiation Dose})}{C_{SENSOR}} \quad (6)$$

$C_{SENSOR}$ is the charge sensing capacitance and is different to the charge sensing capacitance of MOSFET type dosimeters ($C_{OX}$ or alternatively called $C_{DIELECTRIC}$) as described in Equation 1. In order to reduce the charge sensing capacitance of the semiconductor structure, and thereby increase the voltage sensitivity of the sensor, the bulk to channel depletion capacitance ($C_{BULK}$) should be designed to be small, and the length of the semiconductor structure should be sufficiently long such that the drain to channel depletion capacitance, $C_{DRAIN}$, is negligible. A small $C_{BULK}$ can be achieved by increasing the width of the depletion region ($t_b$) through reducing the bulk doping and/or increasing the sensor to bulk voltage difference. However, the bulk doping should be sufficiently high for the designed channel length such that punch-through does not occur between the drain and sensor electrodes.

For a semiconductor structure having the dimensions previously described, where the length of the channel is fabricated to be 223 microns (known as a long channel device), the drain to channel depletion capacitance is considered to be negligible, due to the large distance between sensor and drain junctions, while $C_{BULK}$ is determined by the reverse biased depletion capacitance as set by the bulk depletion depth $t_b$, which is itself dependent on the bulk doping and the applied reverse bias. The following relationship between sensitivity and device parameters applies for a long channel device:

$$|\Delta V_{SENSOR}| = \frac{|\Delta Q_{RAD}|}{C_{BULK}} = (R_{ox} * t_{ox}) * \frac{t_b}{\epsilon_{si}} \quad (7)$$

and $\varepsilon_{si}$ is the dielectric permittivity of silicon.

In order to minimise the effect of temperature variations on sensor operation, the sensor apparatus should also be selected to operate at its Minimum Temperature Drift current $I_{MTD}$. In the embodiment of the invention with the dimensions previously described, this current is 0.25 μA (as shown in FIG. 2B).

Figure 1B:
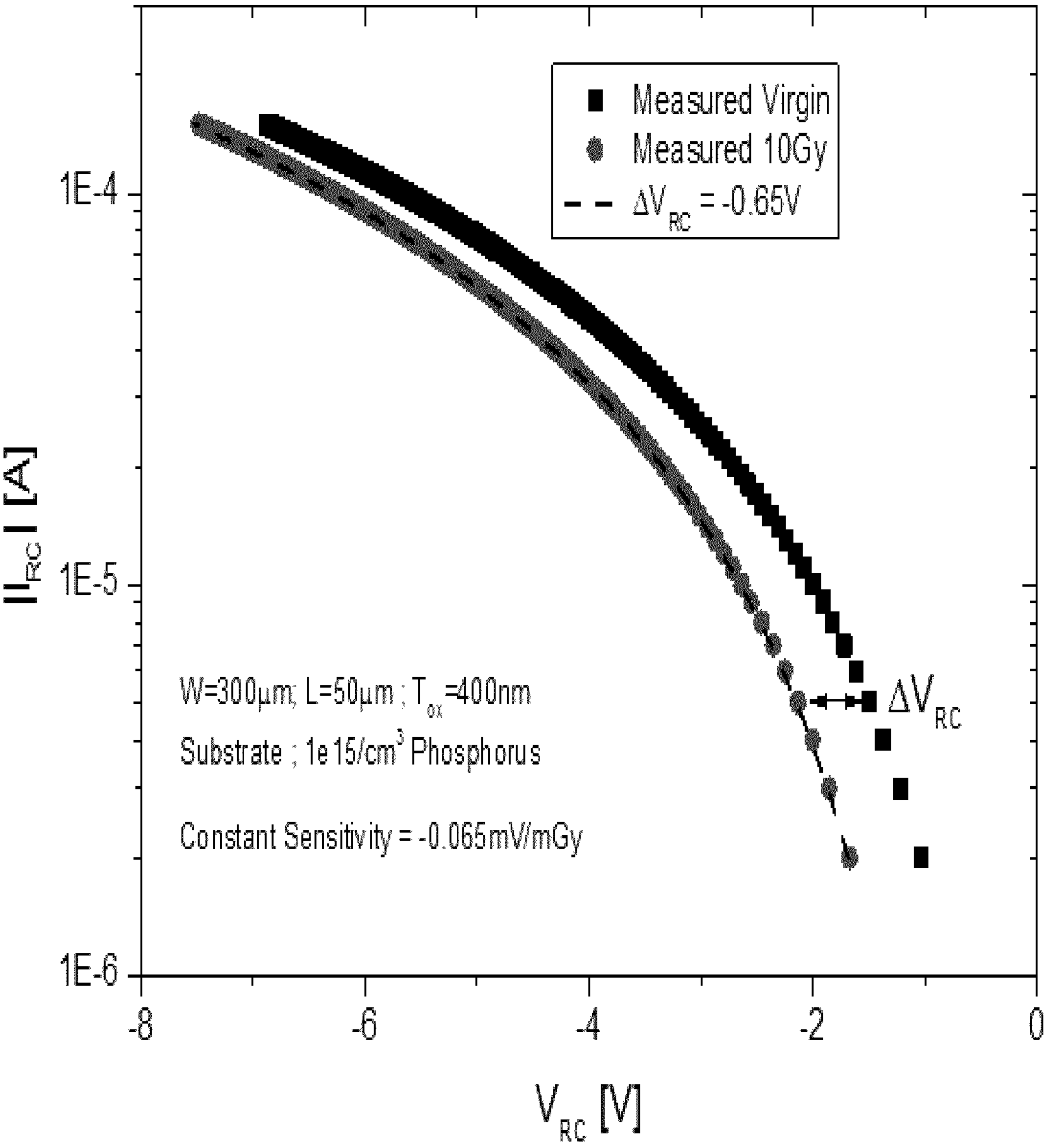
FIG. 1B shows a current-voltage characteristic for the readout circuit of FIG. 1A before and after radiation to 10 Gy using Co60 source.
Figure 2D:
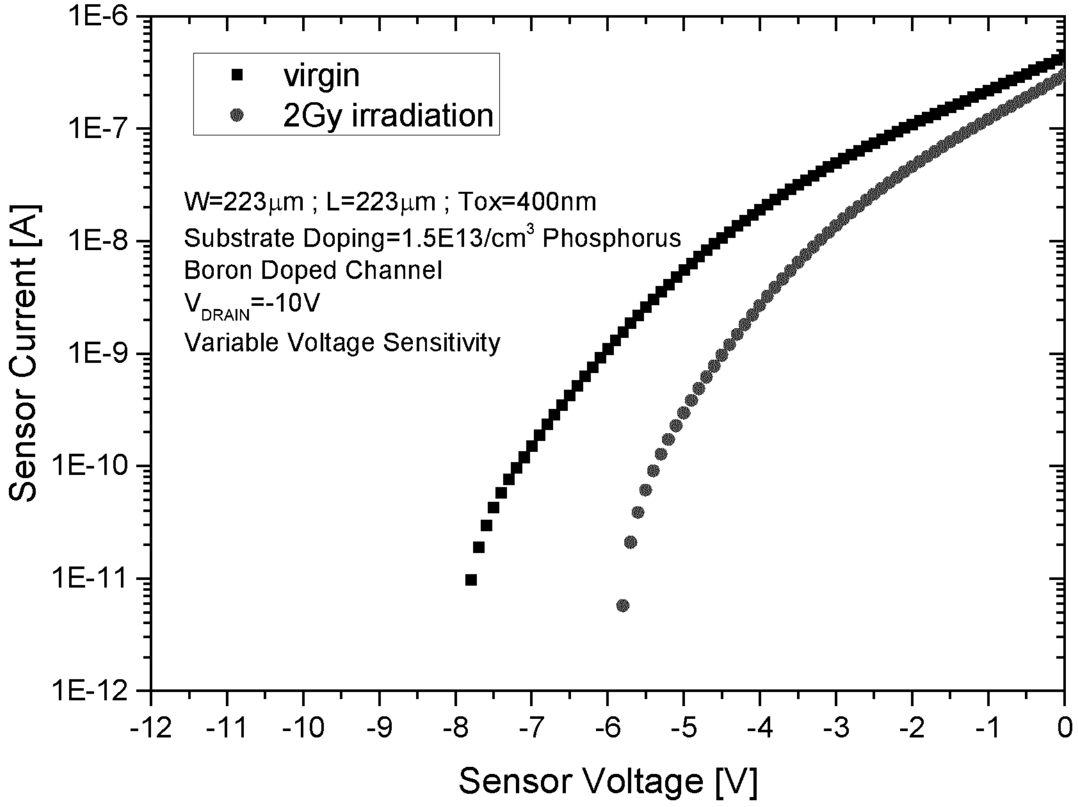
FIG. 2D shows the measured sensor current versus sensor voltage characteristics at 20° C. for the sensor apparatus of FIG. 2B before and after irradiation with Co60 to 2 Gy.

FIG. 2D shows the measured sensor current versus sensor voltage characteristic at 20° C. for the sensor apparatus of FIG. 2B before and after irradiation with Cobalt60 (Co-60) to 2 Gy (which corresponds to a dose typically used in radiotherapy). The drain voltage is fixed at −10V with the bulk voltage grounded and the reverse biased diode currents were measured below 10 pA. All terminals were grounded during irradiation. It can be seen that the curve is shifted after irradiation and the voltage shift magnitude is not constant as a function of sensor current. This is because the semiconductor depletion capacitances ($C_{BULK}$ and $C_{DRAIN}$) are functions of the voltage difference between the sensor electrode and bulk electrodes and drain electrodes respectively. The maximum sensitivity is 1 mV/mGy at a current level of 10 pA with a virgin sensor voltage of −8V. This maximum sensitivity is 15.3 times larger than for the diode controlled MOSFET device having the dimensions described with reference to FIG. 1B. This observed large increase in sensitivity is because $C_{BULK}$ is approximately 15 times smaller than $C_{OX}$ for a sensor voltage of −8V. Thus, it will be appreciated that the sensor apparatus of the present invention is significantly more sensitive than MOSFET based detectors due to its structure and operation.

Figure 2E:
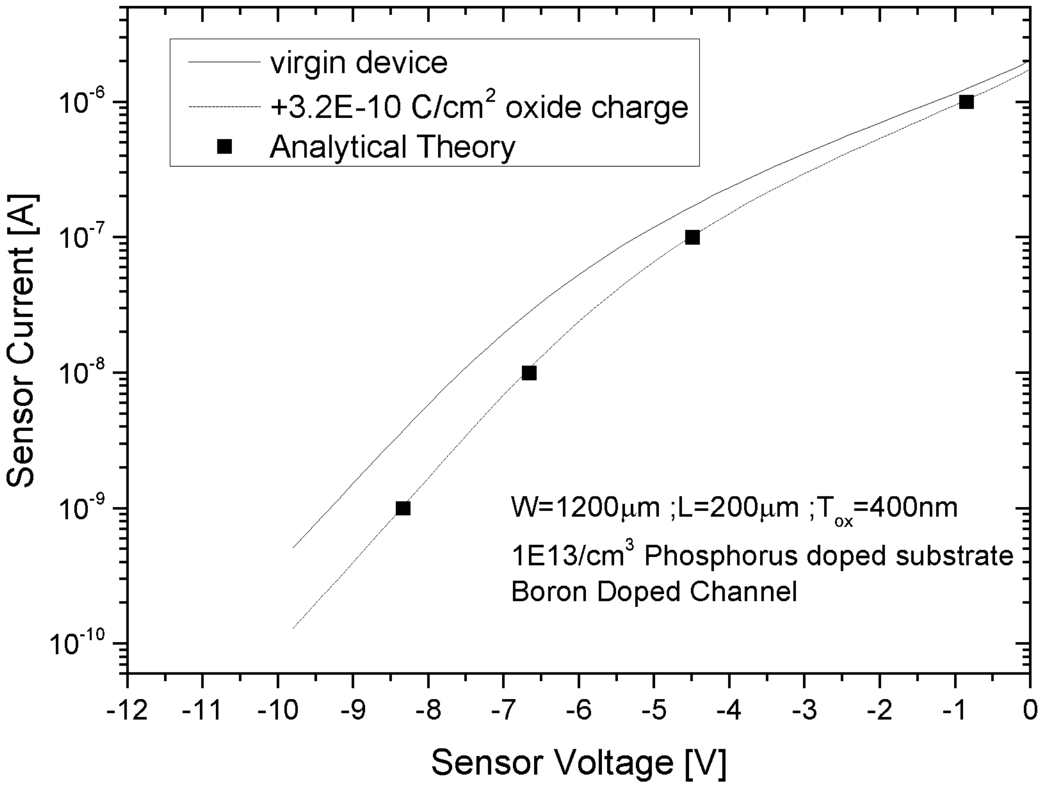
FIG. 2E compares numerical simulations and analytical theory of sensor current versus sensor voltage characteristics for a 200 μm length semiconductor structure for zero dielectric charge and 2E+9 charge density (3.2E−10 $C/cm^2$) in the dielectric.

FIG. 2E compares numerical simulations of sensor current versus sensor voltage characteristics for a 200 μm length PMOS semiconductor structure for zero dielectric charge and 2E+9 charge density (3.2E−10 C/cm$^2$) in the dielectric. The drain voltage is fixed at −10V while the bulk was grounded. 2E+9 charge density represents a low level of dielectric charge which could be trapped during radiological procedures. The bulk silicon substrate dopant is phosphorus at a doping level of 1E+13/cm$^3$. The bulk capacitance values for the analytical theory were extracted from the numerical simulations based on the simulated depletion depths, while the drain capacitance was confirmed to be negligible. The irradiated curve is compared with the analytical theory described by Equations (4) to (6), showing excellent agreement and confirming the cause of the variable shift.

Figure 2F:
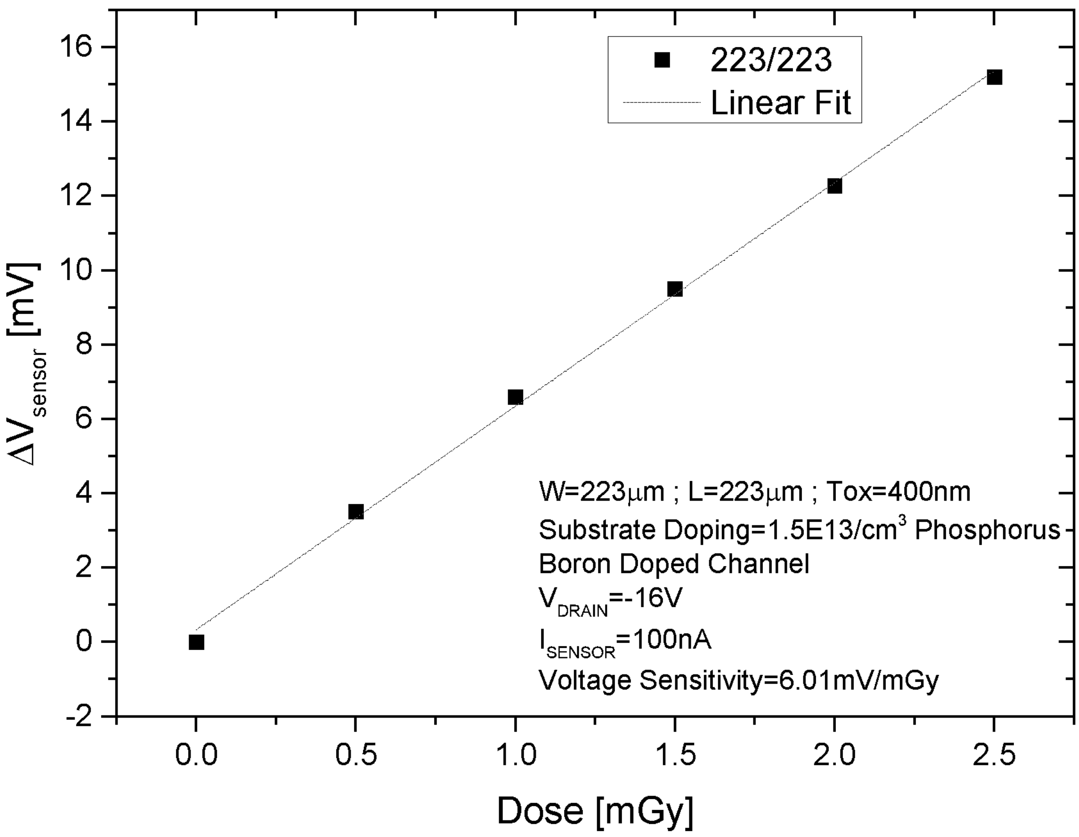
FIG. 2F shows a plot of the sensor voltage shift at a constant sensor current of 100 nA versus radiation dose for the sensor apparatus of FIG. 2B for dose levels and dose energies typically used for CT and Dental X-ray scans.

FIG. 2F shows a plot of the sensor voltage shift at a constant sensor current of 100 nA versus radiation dose for a structure of channel width of 223 μm and a channel length of 223 μm for dose levels and X-ray energies typically used for CT and Dental X-ray scans. During constant sensor current readout, the drain voltage is fixed at −16V while the bulk voltage is grounded and the virgin or initial sensor voltage at 100 nA is −12.4V. All terminals were grounded during irradiation. The measured sensitivity of 6 mV/mGy is the highest recorded sensitivity of any MIS based dosimeter which is unbiased during irradiation. The sensitivity is larger than that shown in FIG. 2D due to a combination of larger virgin sensor voltage and lower photon energy. The larger virgin sensor voltage causes a larger bulk depletion depth ($t_b$) and a larger output signal, while the lower photon energy in the X-ray region results in significantly more trapped charge in dielectric.

In the first embodiment of the invention described with reference to FIGS. 2A to 2F where the semiconductor structure of the sensor apparatus is considered a long channel device, the charge sensing capacitance or sensor capacitance ($C_{SENSOR}$) and hence the sensor sensitivity to radiation charge is not constant as a function of sensor current. This characteristic can be a drawback, due to the fact that it must be ensured that the current source is very precise and the manufacturing process very tight to produce sensors with similar sensitivities across a semiconductor wafer.

This is not an issue for the structures of the semiconductor structure of the second and third embodiments of the sensor apparatus of the invention, both of which structures result in constant charge sensing capacitances as a function of sensor voltage/current. These embodiments are described below.

In the second embodiment of the invention, the semiconductor structure is fabricated to be a short channel device. For short channels, the small signal sensor capacitances can be described as a function of device parameters as follows:

$$C_{SENSOR} = C_{BULK} + C_{DRAIN} = \frac{e_{si} * W * L * BF}{t_b} + \frac{e_{si} * W * t_b * DF}{L} \quad (8)$$

Where $\varepsilon_{si}$ is the dielectric permittivity of silicon, to is the bulk depletion depth in the silicon, L is the channel length, W is the channel width and BF and DF are both fractions less than 1. BF and DF are necessary to account for how much of the depletion capacitance under the channel can be attributed to the vertical (channel to bulk) and lateral (channel to drain) capacitances.

The first term in Equation (8) is the bulk capacitance, while the second term describes the drain capacitance. As previously explained, for long channels such as 223 μm, the second term is negligible. However, in accordance with the second embodiment of the invention, the semiconductor structure is designed with a shorter channel length such that the sum of the capacitances $C_{BULK}$ and $C_{DRAIN}$ remains constant as a function of depletion depth $t_b$, and hence sensor voltage.

Differentiating Equation (8) with regard to $t_b$ and setting this differential equal to zero results in the following necessary condition for constant sensor capacitance:

$$L = t_{bo} * \sqrt{\frac{DF}{BF}} \quad (9)$$

where $t_{bo}$ is the designed bulk depletion depth at maximum sensor to bulk voltage. Therefore, to ensure that $C_{SENSOR}$ remains constant as a function of sensor voltage, L must be designed according to Equation (9). For correct operation, the sensor to bulk voltage should have greater control of channel current than the sensor to drain voltage. Therefore, BF is larger than DF and L must be designed to be less than $t_{bo}$ to satisfy Equation (9).

Figure 3A:
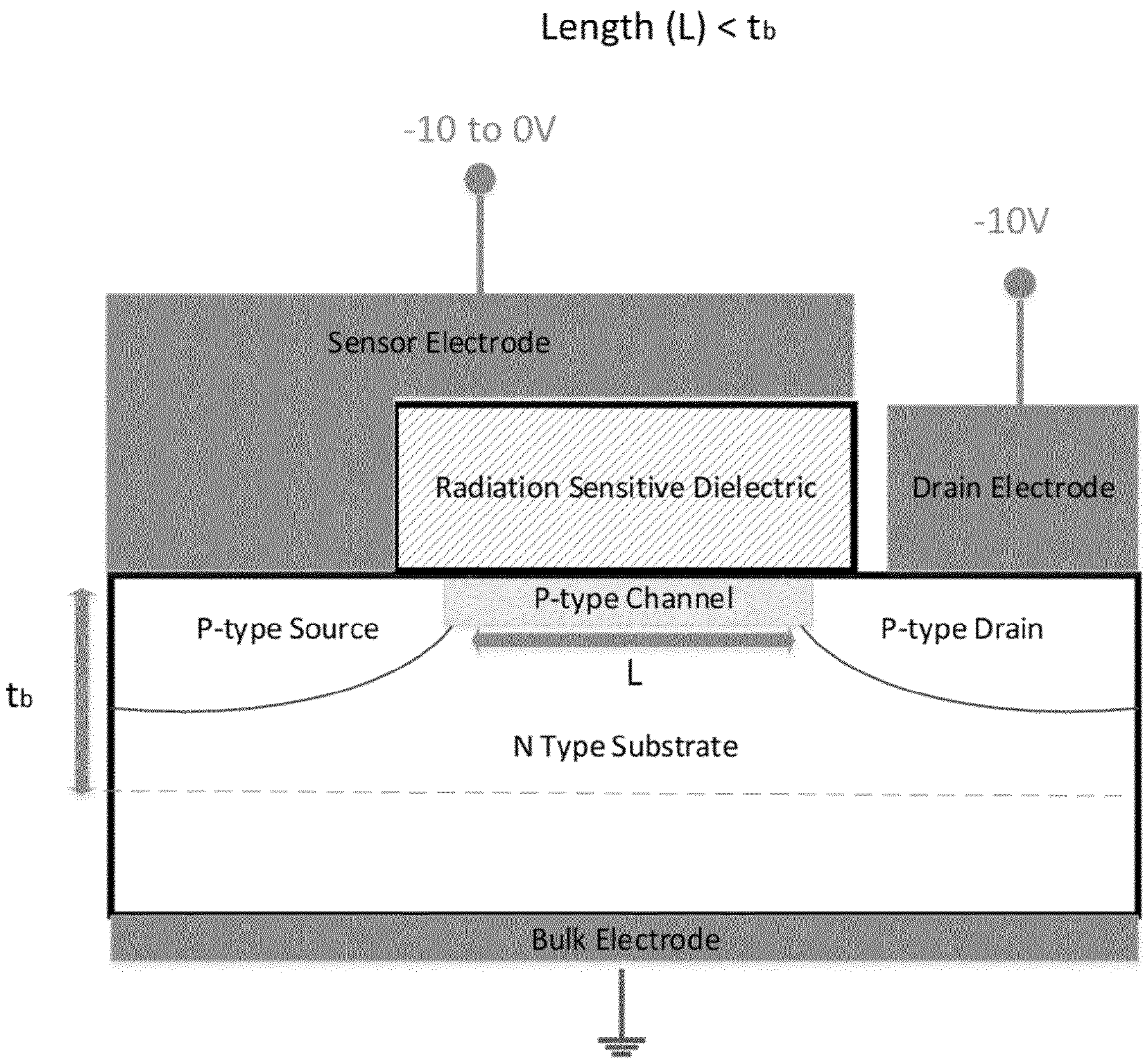
FIG. 3A shows a second embodiment of the sensor apparatus of the present invention where the length of the channel is less than the depletion depth of the sensor-bulk junction.
Figure 3B:
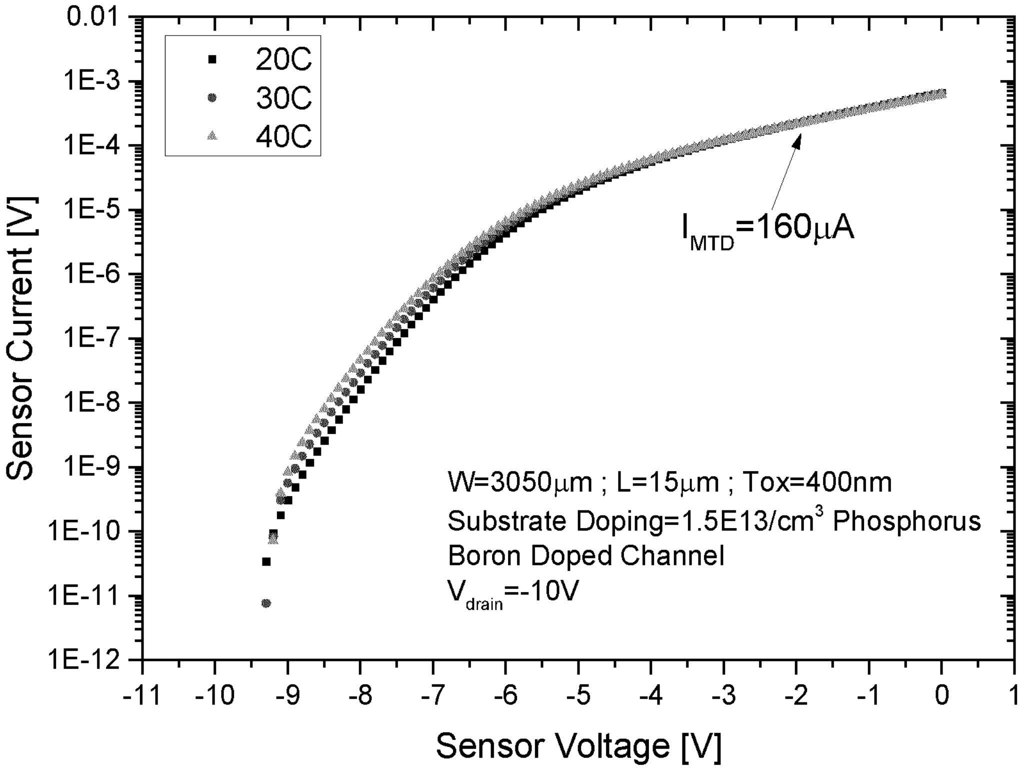
FIG. 3B shows the measured sensor current-voltage curves for a semiconductor structure with a channel length of 15 μm and channel width of 3050 μm at three different operating temperatures.

FIG. 3A shows a schematic of this embodiment of the invention where the length of the channel has been designed to be less than the bulk depletion depth at maximum sensor to bulk voltage ($t_{bo}$). FIG. 3B shows the measured sensor current-voltage curves for a semiconductor structure with a designed channel length of 15 μm and channel width of 3050 μm at operating temperatures of 20 degrees Celsius, 30 degrees Celsius and 40 degrees Celsius. The bulk region is contacted on the top surface. The drain voltage is fixed at −10V while the bulk voltage is grounded. The channel was doped with an activated boron implant to provide channel current while the bulk silicon substrate dopant is Phosphorus with resistivity 300 Ohm-cm (equivalent to a doping level of 1.5E+13/cm$^3$). The channel length has been designed to be less than the bulk depletion depth of 30 μm at a maximum sensor voltage of −10V. The semiconductor structure exhibits a MTD current at 160 μA.

Figure 3C:
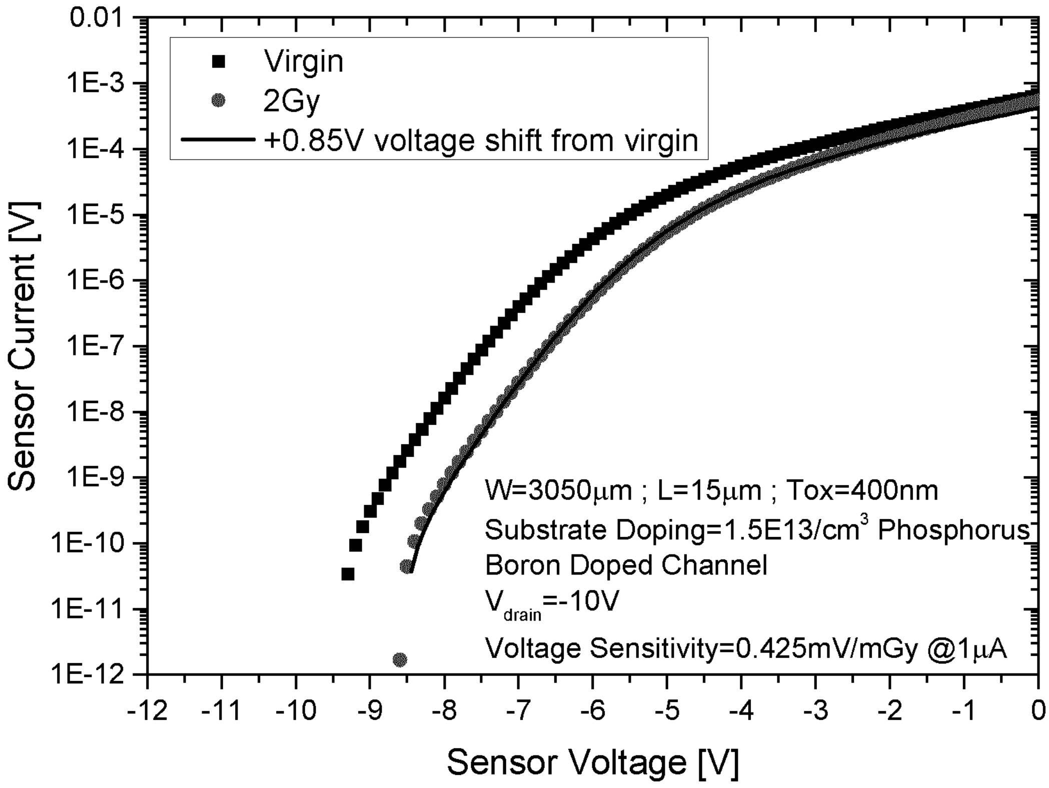
FIG. 3C shows the measured sensor current versus sensor voltage characteristics of the sensor apparatus of FIG. 3B before and after Co60 irradiation of 2 Gy.

FIG. 3C plots the sensor current-voltage characteristics of the sensor apparatus described with reference to FIGS. 3A and 3B before and after Co-60 gamma irradiation of 2 Gy. The drain voltage is fixed at −10V while the bulk voltage is grounded. All terminals were grounded during irradiation. It is clear from the figure that the voltage sensitivity is constant at 0.425V/Gy for a range of operating sensor voltages and currents (in this case, the sensor currents are in the range of 0.01 μA to 1 μA).

Figure 3D:
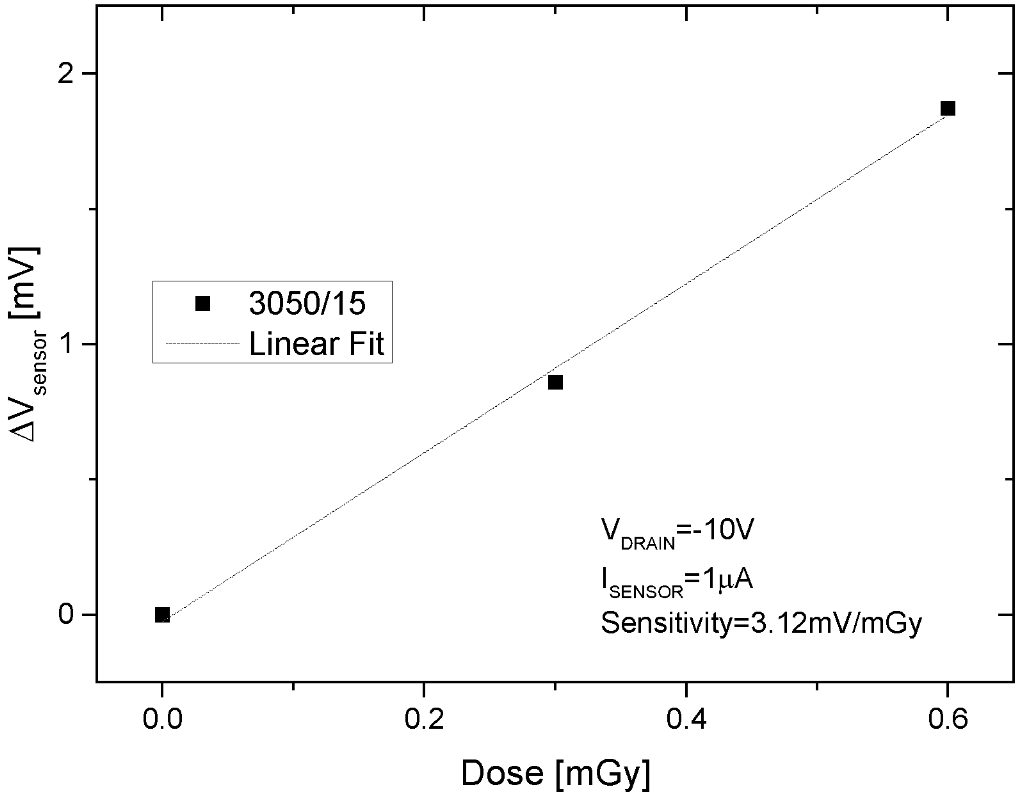
FIG. 3D plots the sensor voltage shift at a constant sensor current of 1 μA versus radiation dose for the sensor apparatus of FIG. 3B for dose levels and X-ray energies typically used for CT and Dental X-ray scans.

FIG. 3D plots the sensor voltage shift at a constant sensor current of 1 μA versus radiation dose for a semiconductor structure with channel width of 3050 μm and a channel length of 15 μm. for dose levels and X-ray energies typically used for CT and Dental X-ray scans. During constant sensor current readout, the drain voltage is fixed at −10V and the bulk voltage is grounded while the initial sensor voltage at 1 μA is −6.8V. All terminals were grounded during irradiation. The recorded voltage sensitivity of 3.12 mV/mGy results in a measured voltage of 0.94 mV for 0.3 mGy dose level.

Figure 4A:
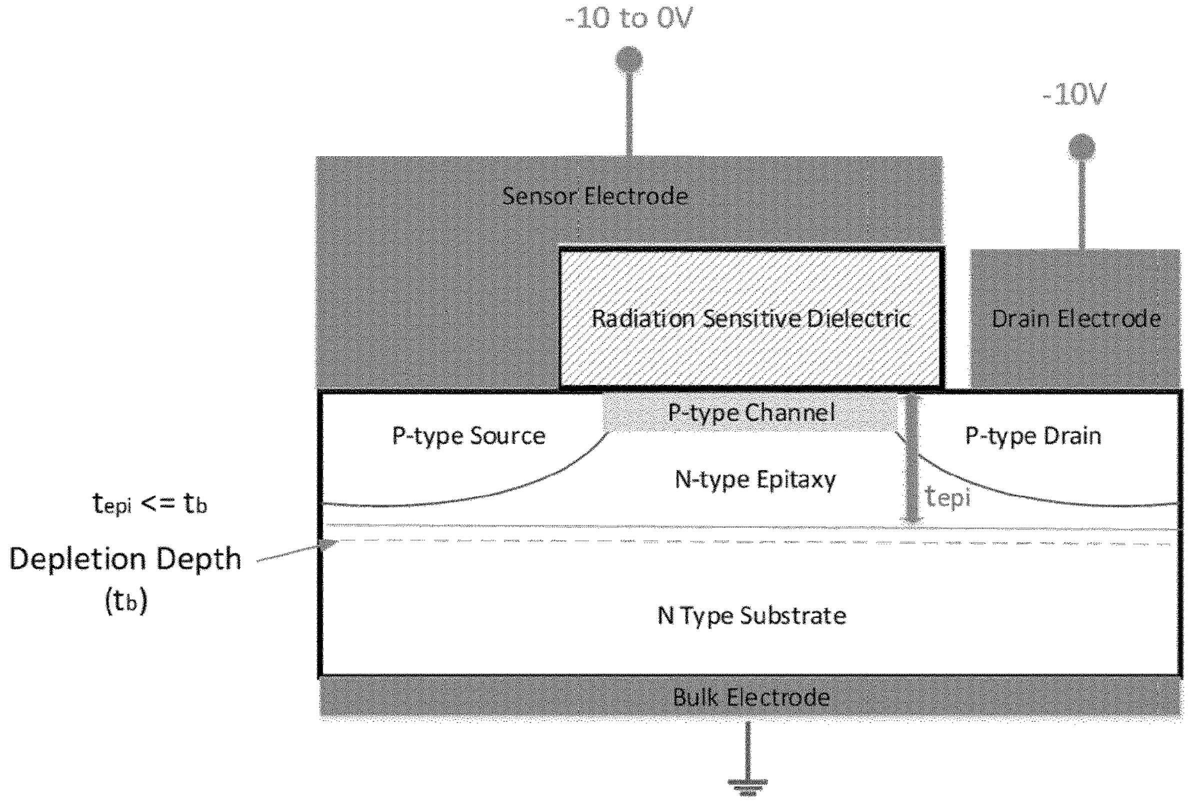
FIG. 4A shows a third embodiment of the sensor apparatus of the present invention which has a retrograde bulk doping profile comprising a low doped n-type epitaxial layer on top of a higher doped n-type bulk substrate.
Figure 4B:
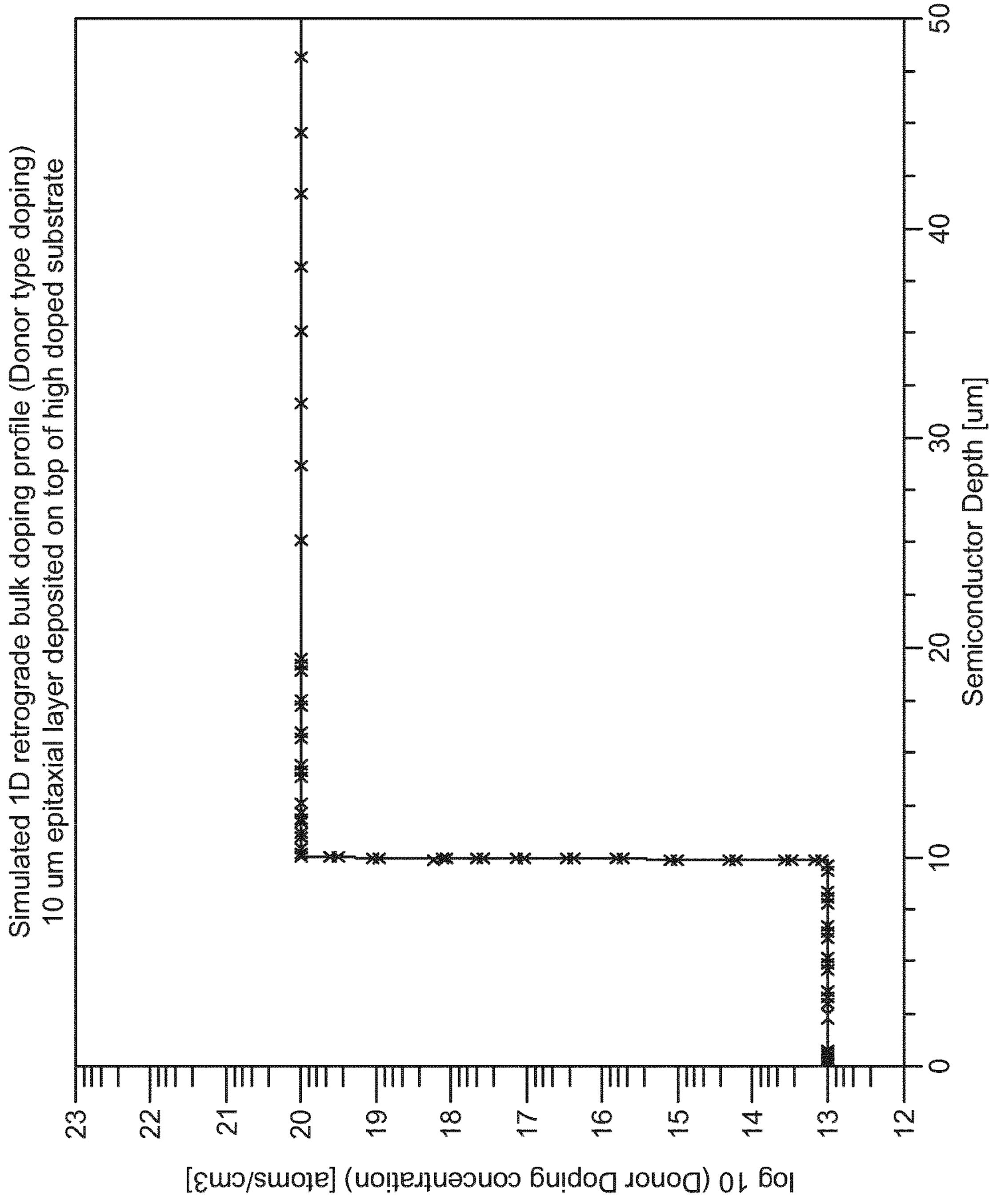
FIG. 4B illustrates one simulated doping profile of donor (n-type) dopant concentration vs semiconductor depth which can realise the retrograde bulk doping profile of FIG. 4A.

In the third embodiment of the invention, the sensor apparatus comprises a semiconductor structure comprising a retrograde bulk doping profile. This structure is based on the understanding that the sensitivity changes with sensor voltage due to the change in sensor capacitance which is determined by changes in the semiconductor depletion depth ($t_b$) with sensor voltage. By fabricating a semiconductor structure which has a retrograde bulk doping profile as shown in FIGS. 4A and 4B, it is possible to keep to constant with sensor voltage once appropriate values of doping and thicknesses are chosen. A constant depletion thickness ($t_b$) is maintained by ensuring that the low doping portion of the bulk region is fully depleted for the full range of sensor currents/voltages. This means that any change in sensor voltage causes a change in the depletion thickness of the high doped portion of the bulk region. With appropriate choice of high bulk doping level, low bulk doping level and thickness of low doped semiconductor layer, the depletion width of the high bulk doping becomes a negligible portion of the overall depletion width, which remains constant during sensor operation.

One method of realising this retrograde bulk doping characteristic is by growing a low doped semiconductor layer by epitaxy on top of a higher doped semiconductor substrate as shown in FIGS. 4A and 4B. However, it will be appreciated that other methods could equally well be used.

Figure 4C:
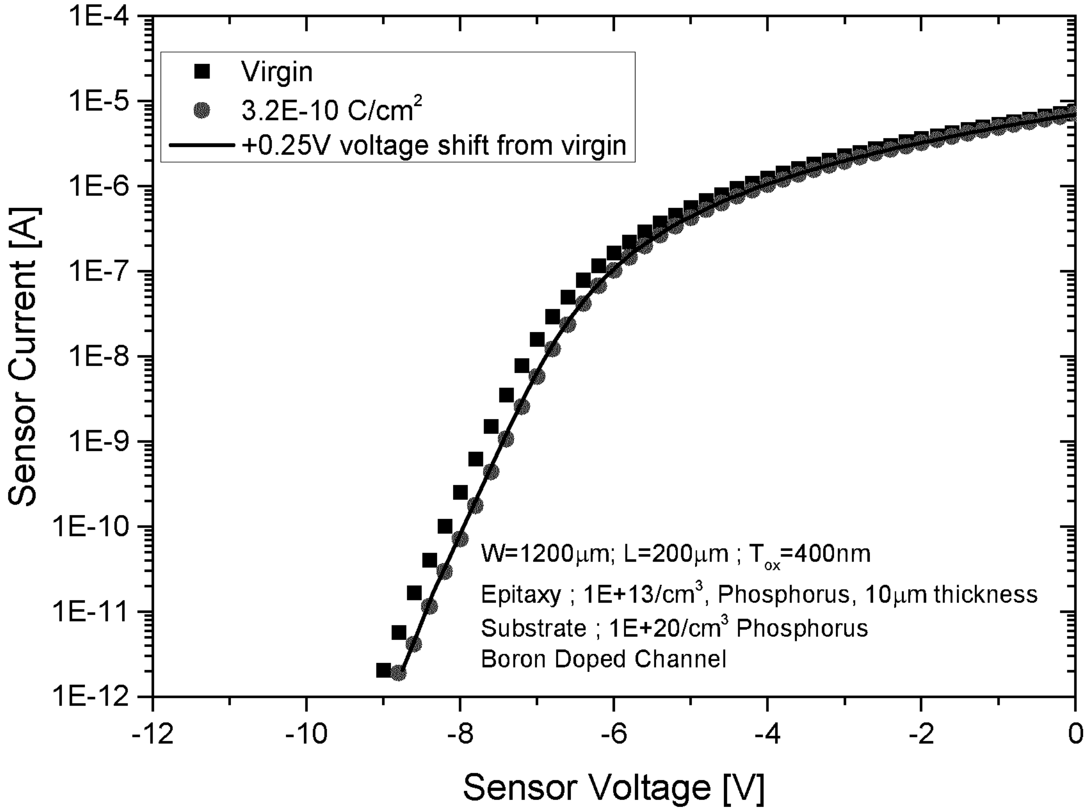
FIG. 4C shows numerical simulations of the sensor current versus sensor voltage characteristic for a sensor apparatus having the structure of FIG. 4A with the retrograde bulk doping profile of FIG. 4B.

FIG. 4C shows numerical simulations of the sensor current versus sensor voltage characteristic for a p-type device having a structure of FIG. 4A with the simulated bulk donor (n-type) retrograde doping profile in FIG. 4B, namely a 1E+13/cm$^3$ phosphorus doped epitaxial layer which is 10 microns thick grown on top of highly doped 1E+20/cm$^3$ phosphorus doped silicon substrate, for both zero charge and 2E+9/cm$^2$ oxide charge. The drain voltage is fixed at −10V while the bulk voltage is grounded. The geometry comprises a channel width of 1200 μm, a channel length of 200 μm and $t_{ox}$ of 400 nm while the channel is doped with an activated boron implant to provide a channel current with reverse bias applied to the sensor-bulk and drain-bulk junctions. It can be seen from this figure that the voltage sensitivity to dielectric charge is constant for the full range of sensor voltages and currents. The simulated value of the voltage sensitivity to dielectric charge, for this particular choice of dopants and geometries, is 0.25V per 2E+9 charges/cm$^2$ or 125 pV per unit stored charge/cm$^2$.

Figure 5A:
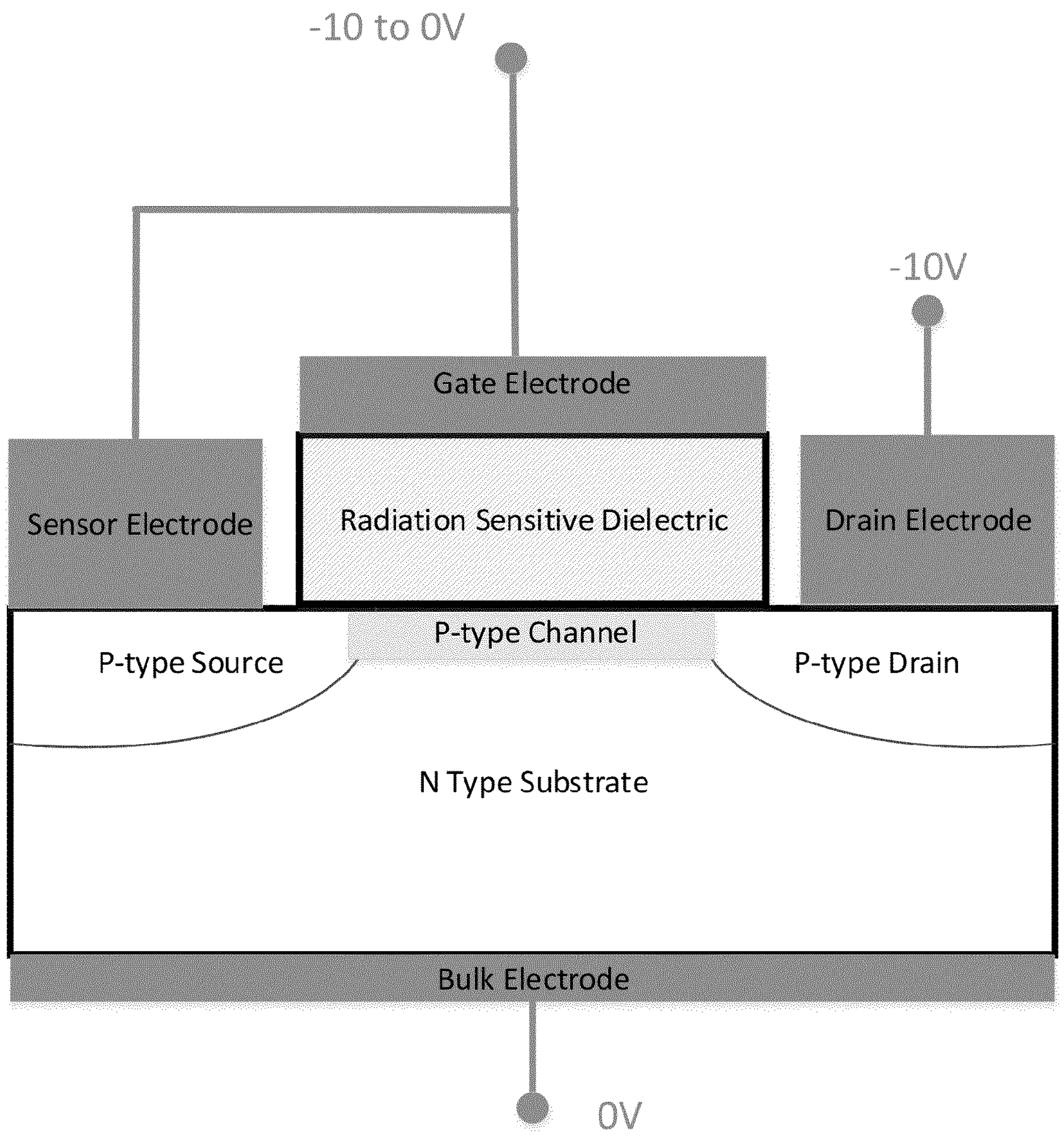
FIG. 5A shows a fourth embodiment of the sensor apparatus of the present invention where the sensor and gate electrodes are formed separately but, during electrical readout, are tied together using external circuitry.

A fourth embodiment of the sensor apparatus of the present invention is shown in FIG. 5A. In this embodiment of the invention, the sensor electrode to which the sensor terminal is connected is not formed as a continuous metal over the gate dielectric and the source region (as per FIGS. 2A, 3A and 4B). Rather, one metal electrode is formed over the gate dielectric and the sensor electrode is provided by a separate metal electrode formed over the source region. During readout, the gate electrode and the sensor electrode are connected together in external circuitry to form the sensor terminal which can produce same readout characteristic as the previous embodiments. The advantage of this embodiment is that the gate dielectric can be biased with a gate voltage during irradiation to enhance the charge sensitivity of the device. However, this structure is more susceptible to electrical noise between the sensor and gate electrodes due to ESD or external sources during irradiation which can cause changes to the sensitivity. Furthermore, this embodiment is susceptible to electrical noise between the separate metal lines over the dosimeter during the readout operation.

Figure 5B:
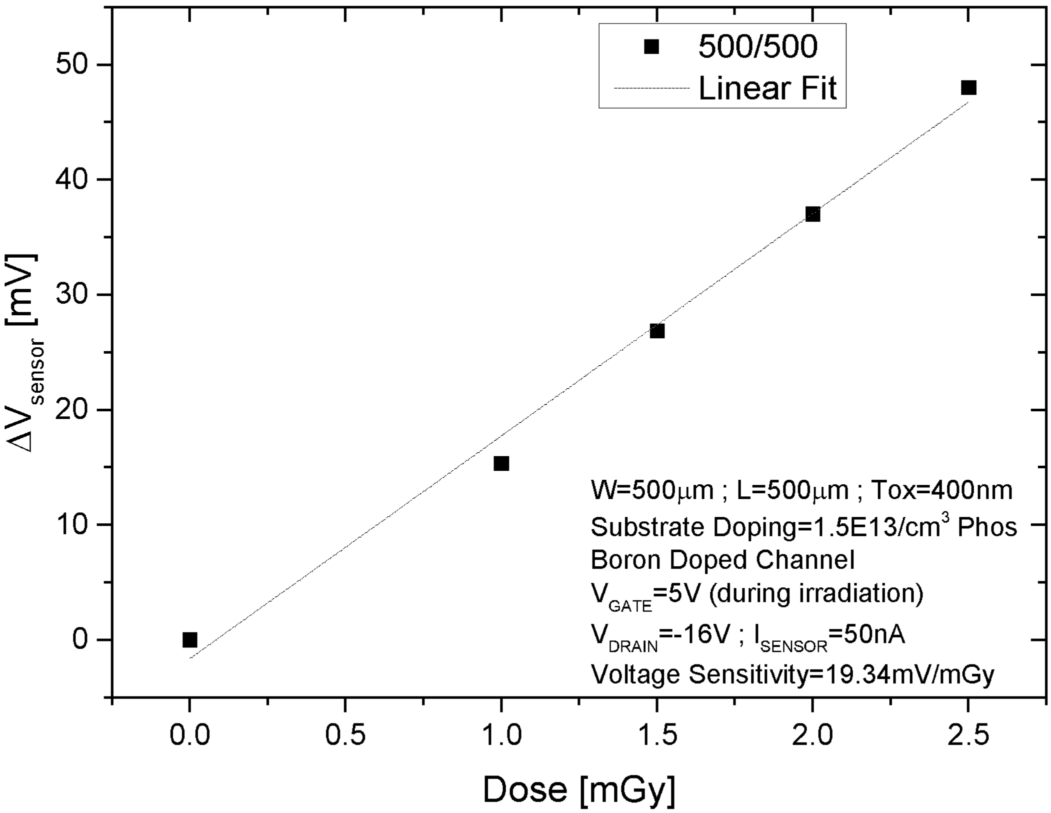
FIG. 5B plots the sensor voltage shift for a constant sensor current of 50 nA versus Xray radiation dose for the sensor apparatus of the fourth embodiment where the gate electrode was biased with +5V during irradiation.

FIG. 5B plots the sensor voltage shift at a constant sensor current of 50 nA versus X-ray radiation dose for the sensor apparatus of the fourth embodiment, where the semiconductor structure geometry comprises a channel width of 500 μm, a channel length of 500 μm and $t_{ox}$ of 400 nm. The bulk silicon substrate dopant is phosphorus with resistivity of 300 Ohm-cm while the channel was doped with an activated boron implant to provide channel current. The bulk region is contacted on the top surface. During constant sensor current readout, the drain voltage is fixed at −16V while the bulk voltage is grounded and the virgin sensor voltage at 50 nA is −13V. The gate electrode of the semiconductor structure was biased with +5V during irradiation while the other terminals were grounded. It can be seen that the sensor apparatus shows a sensitivity of approximately 20 mV/mGy. As a result of the applied gate voltage during irradiation, this embodiment provides the highest reported sensitivity of all of the described embodiments of the invention (in fact achieving a world record for sensitivity for MIS based dosimeters).

The channel noise generated in the MIS sensor of the present invention is higher than in MOSFET dosimeters as a result of the smaller sensor capacitance. This can impact the minimum dose detectable in applications where the sensor noise dominates the total system noise. For channels located directly at the silicon/dielectric interface, the sensor noise is dominated by 1/f noise at low readout frequencies. In one embodiment of the invention, the noise is reduced by fabricating a p-channel sensor with a channel located some distance below the silicon surface. For example, boron can be implanted such that the peak boron profile is 0.1 microns below the silicon/dielectric interface in order to reduce the 1/f noise. Increasing the area of the sensor and the readout frequency also reduces this noise such that it is not a major component in the total noise of the sensor apparatus. The thermally generated random noise of the MOS channel can also be successfully reduced by averaging a number of sensor readings.

As previously mentioned, one method of measuring the change in dielectric charge due to irradiation is by forcing a constant sensor current through the channel of the semiconductor structure before and after irradiation, and monitoring the change in sensor to bulk voltage required to maintain this constant current due to the change in the irradiated oxide charge. The radiation induced charge is then calculated from the change or shift in the measured sensor voltage before and after irradiation. For a p-type MIS sensor, a positive current should be sourced from the sensor electrode which is then sunk by the drain and the corresponding sensor to bulk voltage should be recorded using for example a voltmeter. To ensure that the applied positive current flows into the drain and not into the bulk, the sensor to bulk junction must remain reverse biased for the full range of sensor voltages. For a p-type MIS sensor operating with positive currents and positive voltages, this can be achieved by applying a sufficiently large positive bias to the bulk electrode. In a preferred embodiment for the p-type MIS sensor, the same positive voltage source should be used to bias the bulk electrode and to bias the current source. This positive voltage source is the largest positive voltage in the readout circuit and thus prevents any forward biasing of the sensor-bulk junction. Alternatively, if the bulk electrode of the p-type MIS sensor is grounded by the designer, negative voltages should be used for both the sensor and the drain electrodes.

The thermal drift of the sensor apparatus normally predominantly affects the minimum dose which can be detected by the sensor apparatus in real-world applications where temperature control is not possible. One method of minimising the thermal drift is by choosing the sensor current to be equal to the Minimum Thermal Drift Current ($I_{MTD}$) value as previously explained. Alternatively, the thermal drift can be minimised by monitoring the temperature on the sensor apparatus and compensating for the thermal drift. In one embodiment, the temperature is monitored by forward biasing one of the inbuilt diodes namely the sensor to bulk diode or the drain to bulk diode and recording the diode voltage for a fixed bias current. In an alternative embodiment, the diode temperature sensor is formed by integrating a separate diode onto the same substrate in which the semiconductor sensor of the present invention is formed. The recorded diode voltage provides an accurate measurement of the temperature. Through using a suitable scaling factor, the temperature drift portion of the sensor output voltage can then be compensated.

Another approach to minimising thermal drift is to use a pair of identical sensor apparatus with different sensitivities to radiation and then recording the differential output voltage. The pair of sensors will be ideally located on the same semiconductor substrate to minimise temperature variations due to location. In such a circuit, the degree of matching between the two sensor apparatuses determines the temperature coefficient of the differential signal. The radiation sensitivity is determined by the difference in sensitivities between the sensor apparatuses. In one embodiment, different radiation sensitivities on the matched pair of sensor apparatuses is provided by applying a bias across the dielectric to one of the sensor apparatus during irradiation, while grounding the electrodes of the other sensor apparatus.

It will be understood from the above description of the invention that the sensor apparatus of the present invention comprises three main modules, namely the semiconductor structure, the means for biasing the semiconductor structure to readout the stored charge, and the means for determining the irradiation dose to which the semiconductor structure was exposed. These three modules may be integrated into a single device or may be provided on one or more separate devices interconnectable via wired or wireless connecting means.

As the sensor apparatus of the present invention is capable of sensing 0.3 mGy radiation doses used in dental and CT scans without any power requirement, it is suitable for use in medical applications. To facilitate use of the apparatus in such applications, one or more of the modules of the sensor apparatus may be incorporated into a patch for attachment to the skin of a patient or clinician. The patch can be attached to a skin of a patient undergoing a radiation treatment or monitoring scan. The dose measured through the use of the patch then acts as a quality control for a radiation generator.

In a first embodiment of the patch, the patch only contains the semiconductor structure of the sensor apparatus and a connecting means in the form of electrical connectors such that the structure can be physically inserted into an electronic reader comprising the means for biasing the semiconductor structure to readout the stored charge in the dielectric, and which therefore includes current and voltage source and measure units for measuring the sensor current-voltage characteristic. The reader is preferably handheld and can be designed to accurately measure the sensor to bulk voltages at a constant sensor current before and after irradiation. The electronic reader further comprises the means for determining a change in the current-voltage characteristic due to irradiation so as provide a measurement of the dose received by the patient. In one embodiment, the patch does not require power during irradiation.

In one embodiment, the patch further comprises an electronic memory and/or an identification means to identify the patch. The identification means may take any suitable form, such as for example a barcode. The identification means may additionally store operational information about the individual patch, such as voltage sensitivity and minimum thermal drift current. The electronic memory has capacity to store operational information about the patch and may also be used to identify the patch where a separate identification means is not present.

In a second embodiment of the patch, the patch comprises the semiconductor structure and the electronic readout circuitry comprising the means for biasing the semiconductor structure to measure the sensor current-voltage characteristic. The measured electrical data is then transmitted through a wired or wireless transmission means provided on the patch to an electronic device comprising the means for determining the irradiation dose to which the semiconductor structure was exposed in order to calculate the measured irradiation dose.

In a third embodiment of the patch, the patch comprises the entire sensor apparatus of the invention. Accordingly, in this embodiment, the patch comprises the semiconductor structure, the means for biasing the semiconductor structure and the means for determining the irradiation dose. The patch may further comprise a means for displaying the irradiation dose and/or means for transmitting the measured irradiation dose to a remote system, for example for display, recording or analysis purposes. The irradiation dose data may be transmitted through wired or wireless means.

Figure 6A:
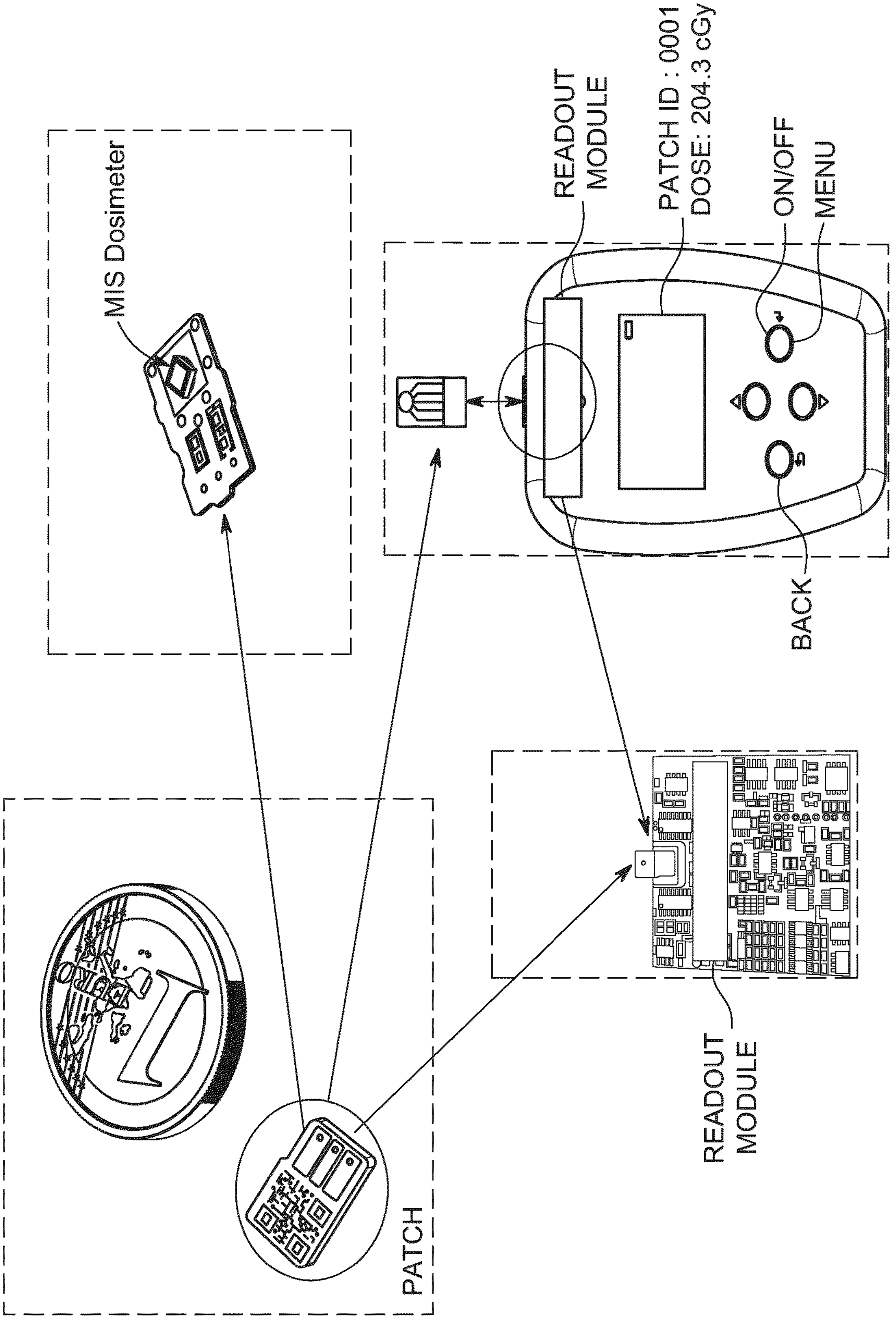
FIG. 6A shows a photograph of one embodiment of a wearable patch incorporating the semiconductor structure of the sensor apparatus present invention together with a photograph of an electronic reader into which the patch is inserted before and after irradiation.

FIG. 6A shows photographs of the first embodiment of the patch which only comprises the semiconductor structure of the sensor apparatus, along with the separate electronic reader comprising the means for biasing the semiconductor structure and the means for determining the irradiation dose. In the embodiment shown in the figure, the patch further comprises an identification means in the form of a barcode printed on the outside of the patch. The patch does not require power during irradiation and is inserted into the electronic reader before and after irradiation in order to measure the change in the sensor electrical characteristics.

Figure 6B:
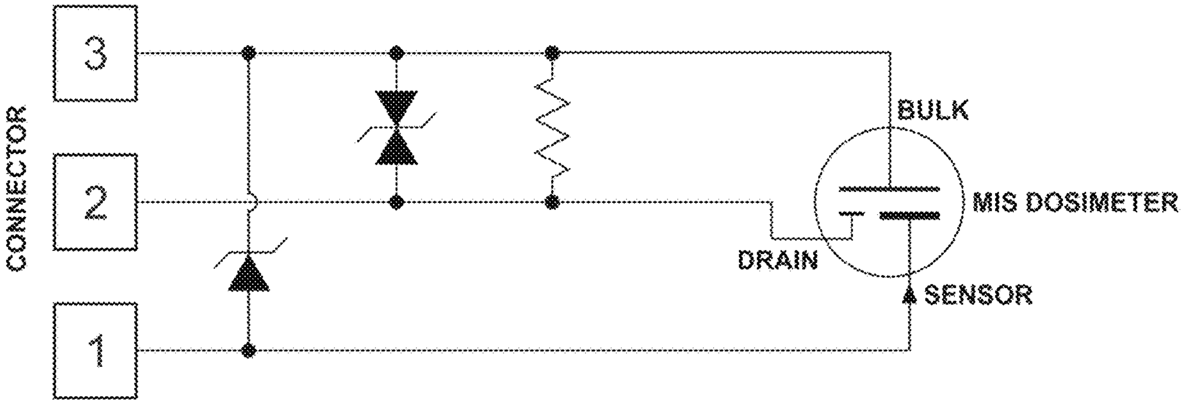
FIG. 6B shows a schematic of the electronic components inside the patch of FIG. 6A.

FIG. 6B shows an electrical schematic of the electronic components inside the patch of FIG. 6A. These components comprise the semiconductor structure of the sensor apparatus of the present invention, two ESD protection diodes and one resistor. The diodes protect the semiconductor structure from ESD, while the resistor provides a conductive path such that all the terminals of the semiconductor structure are kept at approximately the same potential during irradiation. The patch further comprises three electrical connectors for connecting to the electronic reader.

Figure 6C:
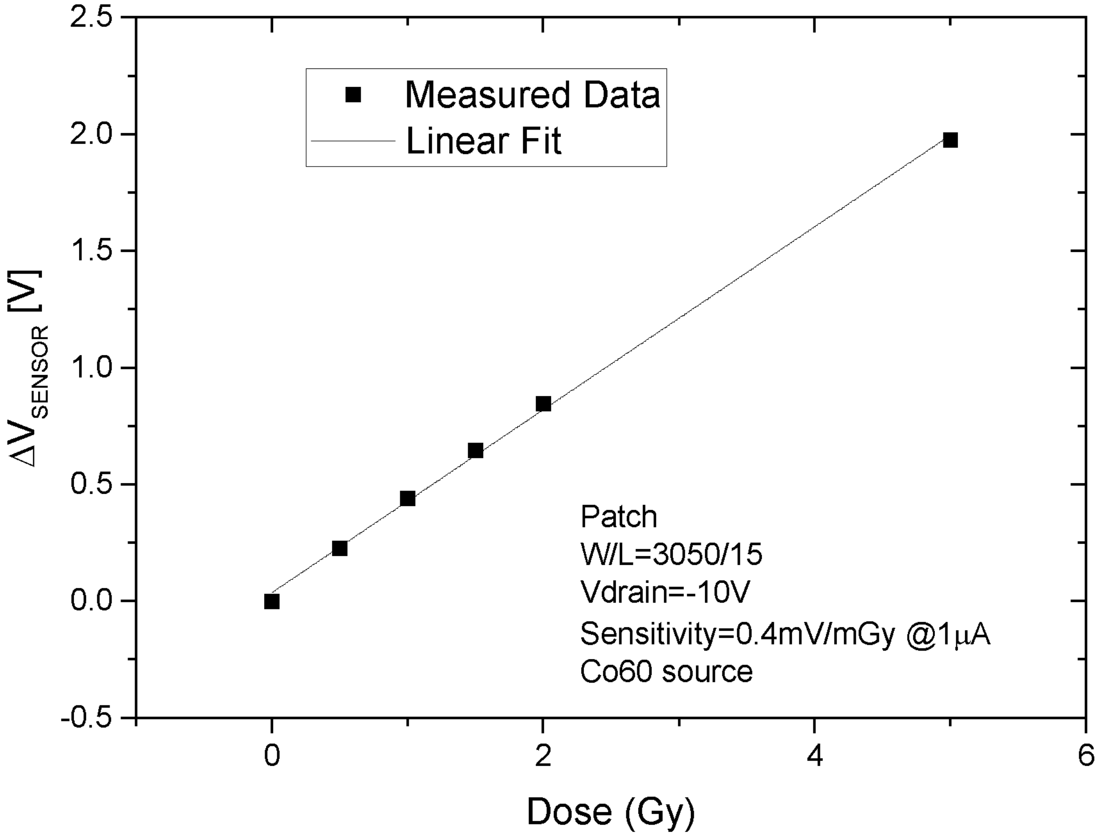
FIG. 6C plots sensor voltage shift at a constant sensor current of 1 μA versus Co60 radiation dose for the patch and reader of the sensor apparatus of FIGS. 6A and 6B.

FIG. 6C shows the measured sensor voltage versus Co60 irradiation dose for the sensor apparatus comprising the patch and reader depicted in FIG. 6A and FIG. 6B and which utilised a 3050/15 sized semiconductor structure as described in FIG. 3. The measurements confirm good linearity and with the same expected sensitivity to Co60 irradiation as shown in FIG. 3C.

The sensor apparatus of the present invention has numerous advantages over conventional RADFET dosimeters. Unlike a conventional RADFET device where its capacitance is limited by the thickness of the sensing dielectric, it is possible with the semiconductor structure of the sensor apparatus of the present invention to have orders of magnitude of lower capacitance, and corresponding higher sensitivity, through appropriate choice of bulk doping, sensor voltage and length of the channel.

Furthermore, as the charge sensing capacitance ($C_{SENSOR}$) of the semiconductor structure is not primarily determined by the sensing dielectric capacitance, through the use of high Z, high dielectric constant dielectric materials which stop more incident radiation than a $SiO_2$ dielectric, increased sensitivity can be achieved. The sensor apparatus of the present invention also enables the sensor voltage to be readout with minimised thermal drift.

In some embodiments of the invention, the construction of the sensor electrode provides inbuilt immunity to external ESD and EMI threats, which are critical for a number of applications. Due to these features, the sensor apparatus of the present invention can more reliably detect lower doses of radiation than conventional MOSFET/RADFET or MIS capacitor sensors.

By providing a sensor apparatus with improved sensitivity, the sensor apparatus improves the product performance for existing applications, such as aerospace, defence, high energy physics and radiotherapy. Furthermore, the improvement in sensitivity enables the sensor apparatus of the present invention to be used in applications where lower radiation doses need to be monitored, such as during X-ray diagnostic procedures (such as dental and CT scanning) or personnel monitoring for medical, industrial and security personnel, where radiation fields are expected to be higher than normal.

When the one or more modules of the sensor apparatus of the present invention is incorporated into a patch, the patch does not suffer from the problem of a lack of sensitivity which is encountered by MOSFET based patches. It furthermore reduces the requirement for external components to prevent ESD and EMI interference. In addition, the electronic readout of such a patch is simple, and the need for expensive measurement equipment such as those used by OSLD patches is obviated.

The invention claimed is:

1. A sensor apparatus comprising:

a semiconductor structure comprising:

a semiconductor substrate, a bulk region of a first conductivity type formed in the semiconductor substrate, a source region and a drain region formed in the bulk region, wherein the source region and the drain region are of a second conductivity type opposite to the first conductivity type, a channel region formed between the source region and the drain region, a dielectric formed on the channel region for storing a charge due to an irradiation, and a gate electrode formed on the dielectric;

means for biasing the semiconductor structure to readout a stored charge in the dielectric by exhibiting a current-voltage characteristic, which is proportional to the stored charge in the dielectric, wherein the means for biasing the semiconductor structure configures the semiconductor structure such that:

the gate electrode and the source region are electrically connected to form a sensor terminal, and the bulk region is biased with a fixed voltage such that the bulk region is reverse biased with respect to the sensor terminal and the drain region, and the drain region is biased with a fixed voltage such that the drain region sinks a channel current sourced from the sensor terminal, and wherein the channel region is configured to provide a channel current from the sensor terminal to the drain region, which is larger in a magnitude than a reverse biased bulk-sensor current and a reverse-biased bulk-drain diode current; and means for determining a change in a current-voltage characteristic of the sensor terminal due to an irradiation to provide a measurement of an irradiation dose to which the semiconductor structure was exposed.

2. The sensor apparatus of claim 1, wherein the channel region further comprises an activated channel implant of the second conductivity type opposite to the first conductivity type.

3. The sensor apparatus of claim 2, wherein a peak of the activated channel implant is located below and spaced apart from the dielectric.

4. The sensor apparatus of claim 1, further comprising an electrode, wherein the electrode further contacts the source region to form a sensor electrode, and wherein the sensor electrode and the gate electrode are electrically connected to form the sensor terminal during an electrical readout of the stored charge in the dielectric.

5. The sensor apparatus of claim 1, wherein the means for biasing the semiconductor structure is configured such that a bias is applied to the gate electrode during an irradiation.

6. The sensor apparatus of claim 1, wherein the gate electrode further contacts the source region to form a sensor electrode, and wherein the sensor terminal is connected to the sensor electrode for an electrical readout of the stored charge in the dielectric.

7. The sensor apparatus of claim 1, wherein the means for determining the change in the current-voltage characteristic of the sensor terminal due to the irradiation comprises means for determining for a given constant sensor terminal to drain current applied to the semiconductor structure a change in a sensor terminal to bulk voltage due to an irradiation of the semiconductor structure.

8. The sensor apparatus of claim 7, further comprising a current source for applying the constant sensor terminal to drain current, and wherein the means for determining for the given constant sensor terminal to drain current applied to the semiconductor structure the change in the sensor terminal to bulk voltage comprises a voltmeter provided between the sensor terminal and the bulk region.

9. The sensor apparatus of claim 7, wherein a change in the sensor terminal to bulk voltage due to an irradiation corresponds to a sensor terminal voltage, $\Delta V_{SENSOR}$, and wherein $\Delta V_{SENSOR}$ for a constant sensor terminal to drain current, a sensor terminal current, is in accordance with the following expression:

$$|\Delta V_{SENSOR}| - |\Delta Q_{RAD}|/C_{SENSOR}$$

where $\Delta Q_{RAD}$ IS a charge of the dielectric due to an irradiation and $C_{SENSOR}$ is a charge sensing capacitance, with $C_{SENSOR}=C_{BULK}+C_{DRAIN}$, where $C_{BULK}$ is a bulk to channel depletion capacitance and $C_{DRAIN}$ is a drain to channel depletion capacitance, and wherein $C_{BULK}$ is inversely proportional to a width of a bulk depletion layer, to, and $C_{DRAIN}$ is inversely proportional to a length of the channel region, L, and where to and L are designed such that $C_{SENSOR}$ is of a lower magnitude than a magnitude of $C_{DIELECTRIC}$.

10. The sensor apparatus of claim 9, where bulk doping and the length of the channel region, L, are configured such that $C_{DRAIN}$ is negligible, such that the change in the sensor terminal to bulk voltage $\Delta V_{SENSOR}$ due to an irradiation for a constant sensor terminal to drain current is in accordance with the following expression:

$$|\Delta V_{SENSOR}| - |\Delta Q_{RAD}|/C_{BULK}.$$

11. The sensor apparatus of claim 9, wherein the length of the channel region, L, is less than the width of the bulk depletion layer, to, at a maximum sensor terminal to bulk voltage.

12. The sensor apparatus of claim 1, wherein the bulk region comprises a retrograde doping profile.

13. The sensor apparatus of claim 12, wherein the bulk region further comprises a doped substrate and a doped semiconductor layer on top of the doped substrate, where a doping level of the doped substrate is higher than a doping level of the doped semiconductor layer.

14. The sensor apparatus of claim 13, wherein the semiconductor substrate further comprises a bulk depletion layer, to, where a thickness of the doped semiconductor layer is less than a width of the bulk depletion layer, to, during a readout of the stored charge in the dielectric.

15. The sensor apparatus of claim 14, further comprising a current source for applying a constant sensor terminal to drain current, wherein the current source is configured to select a sensor terminal to drain current applied so as to minimize a thermal drift of a sensor terminal to bulk voltage.

16. The sensor apparatus of claim 14, further comprising a means for monitoring a temperature of the semiconductor structure and a means for compensating for a thermal drift of a sensor terminal to bulk voltage.

17. The sensor apparatus of claim 16, wherein the means for monitoring the temperature of the semiconductor structure comprises a forward biased diode located on the semiconductor substrate.

18. The sensor apparatus of claim 17, wherein the forward biased diode comprises a source to bulk diode or a drain to bulk diode, which is biased in a forward region of an operation.

19. The sensor apparatus of claim 1, wherein the dielectric comprises a high Z material.

20. The sensor apparatus of claim 1, wherein the bulk region comprises a semiconductor substrate.

21. The sensor apparatus of claim 1, further comprising a wearable patch and an electronic reader, wherein the semiconductor structure is incorporated into the wearable patch, and wherein the means for biasing the semiconductor structure and the means for determining a change in a current-voltage characteristic of the sensor terminal due to an irradiation are incorporated into the electronic reader, and wherein the electronic reader is connectable to the wearable patch, wherein the electronic reader is connected to the wearable patch during a readout.

22. The sensor apparatus of claim 1, further comprising a wearable patch and an electronic reader, wherein the semiconductor structure and the means for biasing the semiconductor structure are incorporated into the wearable patch, and wherein the means for determining a change in a current-voltage characteristic of the sensor terminal due to an irradiation is incorporated into the electronic reader, and wherein the wearable patch further comprises means for transmission of a sensor terminal current and voltage data to the electronic reader to measure an irradiation dose.

23. A sensor circuit comprising:

the first sensor apparatus of claim 1; and a second sensor apparatus of claim 1, wherein the first sensor apparatus and the second sensor apparatus comprise the same semiconductor substrate, wherein the first sensor apparatus and the second sensor apparatus have the same thermal drift, and wherein a sensitivity to an irradiation of the second sensor apparatus is configured to be different than a sensitivity to an irradiation of the first sensor apparatus;

means for determining a differential output voltage signal between the first sensor apparatus and the second sensor apparatus; and means for compensating for a temperature drift of the first sensor apparatus and the second sensor apparatus based on the differential output voltage signal.

24. A wearable patch comprising: the sensor apparatus of claim 1, means for transmitting the measured irradiation dose to a remote system, and/or a display means for displaying the measured irradiation dose.

25. The sensor apparatus of claim 23 or claim 22, wherein the wearable patch further comprises an electronic memory and/or an identification means.

* * * * *